United States Patent
Hikichi

(10) Patent No.: US 11,558,052 B2
(45) Date of Patent: Jan. 17, 2023

(54) SEMICONDUCTOR DEVICE

(71) Applicant: ABLIC Inc., Tokyo (JP)

(72) Inventor: Tomoki Hikichi, Tokyo (JP)

(73) Assignee: ABLIC INC., Tokyo (JP)

( * ) Notice: Subject to any disclaimer, the term of this patent is extended or adjusted under 35 U.S.C. 154(b) by 33 days.

(21) Appl. No.: 17/193,829

(22) Filed: Mar. 5, 2021

(65) Prior Publication Data

US 2021/0288645 A1 Sep. 16, 2021

(30) Foreign Application Priority Data

Mar. 13, 2020 (JP) .............................. JP2020-043602
Jan. 19, 2021 (JP) .............................. JP2021-006274

(51) Int. Cl.
| | |
|---|---|
| *H03K 17/90* | (2006.01) |
| *H03K 19/21* | (2006.01) |
| *G01R 33/07* | (2006.01) |
| *H01L 43/06* | (2006.01) |
| *G01R 33/00* | (2006.01) |

(52) U.S. Cl.
CPC ......... *H03K 17/90* (2013.01); *G01R 33/0023* (2013.01); *G01R 33/07* (2013.01); *H01L 43/065* (2013.01); *H03K 19/21* (2013.01)

(58) Field of Classification Search
CPC ..... G01R 33/07; G01R 33/077; G01R 15/202
See application file for complete search history.

(56) References Cited

U.S. PATENT DOCUMENTS

| | | | |
|---|---|---|---|
| 2010/0026281 A1 | 2/2010 | Nishikawa | |
| 2012/0086444 A1* | 4/2012 | Chen | ........................ H01L 29/82 |
| | | | 324/251 |
| 2014/0176125 A1* | 6/2014 | Friedrich | ........... G01R 33/0023 |
| | | | 324/207.2 |
| 2014/0176126 A1* | 6/2014 | Friedrich | ............. G01R 33/077 |
| | | | 324/207.2 |
| 2015/0276894 A1* | 10/2015 | Ricotti | ............... G01R 33/0029 |
| | | | 324/251 |
| 2016/0349083 A1* | 12/2016 | Guo | ......................... H02P 7/05 |
| 2017/0317622 A1* | 11/2017 | Cai | ...................... H02K 11/215 |
| 2018/0313909 A1* | 11/2018 | Iriguchi | ............. G01R 33/0082 |

FOREIGN PATENT DOCUMENTS

JP 2009-2851 A 1/2009

* cited by examiner

*Primary Examiner* — Jermele M Hollington
*Assistant Examiner* — Temilade S Rhodes-Vivour
(74) *Attorney, Agent, or Firm* — Crowell & Moring LLP

(57) ABSTRACT

The semiconductor device includes a magnetic switch provided to a semiconductor substrate. The magnetic switch includes: a horizontal Hall element including first electrodes and second electrodes arranged at positions perpendicular to the first electrodes; a switch circuit configured to select a drive current direction of the Hall element from four directions; an SH comparator configured to alternately perform a first operation for sampling a signal transmitted from the Hall element and a second operation for sending a signal which is based on a result of comparing a value of the sampled signal and a reference value; a latch circuit configured to hold this sent signal and send the held signal as a latch output signal; and a control circuit configured to select the drive current direction in each of a period for the first operation and a period for the second operation based on the latch output signal.

12 Claims, 19 Drawing Sheets

| SIGNAL | FIRST CONTROL LOGIC PATTERN | | | | SECOND CONTROL LOGIC PATTERN | | | |
|---|---|---|---|---|---|---|---|---|
| | H level (N-pole detection) | | L level (S-pole detection) | | H level (N-pole detection) | | L level (S-pole detection) | |
| S3 | Φ1 | Φ2 | Φ1 | Φ2 | Φ1 | Φ2 | Φ1 | Φ2 |
| Φ | H | L | H | L | H | L | H | L |
| CLK | L | H | L | H | L | H | L | H |
| CLKX | L | H | L | L | L | L | L | H |
| Sd1 | H | L | L | L | L | L | H | L |
| Sd2 | L | L | H | L | H | L | L | L |
| Sd3 | L | L | L | L | H | H | L | L |
| Sd4 | L | H | H | H | L | L | L | H |
| St1 | L | L | L | L | L | L | L | L |
| St2 | H | L | L | H | L | H | H | L |

FIG. 4

$B_{OSDP1} = (V_{OS1} - V_{OS2})/2K_H > 0$ $B_{OSPD2} = (V_{OS2} - V_{OS1})/2K_H < 0$

SEMICONDUCTOR DEVICE

RELATED APPLICATIONS

This application claims priority to Japanese Patent Application No. 2020-043602, filed on Mar. 13, 2020, and Japanese Patent Application No. 2021-006274, filed on Jan. 19, 2021, the entire contents of which are incorporated herein by reference.

BACKGROUND OF THE INVENTION

1. Field of the Invention

The present invention relates a semiconductor device.

2. Description of the Related Art

A Hall element is used for various applications as a magnetic sensor because the Hall element can detect a position and an angle in a non-contact manner. As an example of the applications of the Hall element, there is a magnetic switch. The magnetic switch includes, for example, a Hall element and peripheral circuits including an amplifier and a comparator, and is formed by packaging the Hall element and the peripheral circuits on a semiconductor chip. In regard to classification of the magnetic switch with attention being given to methods of detecting magnetism, there are known a bipolar detection type capable of detecting magnetic fields of both the South pole (hereinafter, referred to as "S-pole") and the North pole (hereinafter, referred to as "N-pole") and an alternation detection type capable of detecting an alternating magnetic field of the S-pole and N-pole alternating with a lapse of time.

In an alternation detection type magnetic switch and a bipolar detection type magnetic switch, a symmetric property between an S-pole side threshold value and an N-pole side threshold value is important. Meanwhile, an asymmetric property occurs due to influences of offset voltages of the Hall element itself and the amplifier and comparator arranged in stages subsequent to the Hall element.

The magnetic switch may have a hysteresis width set from the viewpoint of preventing chattering of an output signal due to internal and disturbance noise at the time of applying a zero magnetic field. The hysteresis width is defined by a difference between an operating point being the S-pole side threshold value and a returning point being the N-pole side threshold value. A magnetic offset is defined by an average value of the operating point and the returning point. The magnetic offset is used as a measure representing the symmetric property of sensitivity between magnetic poles, and is ideally zero.

In the application for detecting an alternating magnetic field, the occurrence of a shift in the operating point or returning point increases a shift in a duty ratio or phase of an output pulse signal. The shift in the duty ratio or phase of the output pulse signal is not desired because the shift causes rotation speed fluctuations and vibrations in a brushless DC (BLDC) motor being a main application of the alternation detection type magnetic switch.

In the bipolar detection type magnetic switch, lack of polarity control of magnets to be used in combination leads to variations in detection distance of a magnetic body detection mechanism, and may cause an offset voltage. As one of methods of eliminating an offset voltage, there is known a spinning current method. There is proposed a technology for eliminating the offset voltages of the Hall element and the amplifier in the subsequent stage through use of the spinning current method and further eliminating the asymmetric property ascribable to the offset voltage of the comparator.

The technology disclosed in Japanese Patent Application Laid-open No. 2009-2851 is a technology using a so-called two-way drive spinning current method. The spinning current method includes a four-way drive spinning current method in addition to the two-way drive spinning current method described above. The two-way drive spinning current method and the four-way drive spinning current method each have advantages and disadvantages. The two-way drive spinning current method is superior to the four-way drive spinning current method from the viewpoint of speeding up processing (shortening a processing time).

However, the technology using the conventional two-way drive spinning current method described above is inferior to the technology using the four-way drive spinning current method from the viewpoint of the symmetric property of a magnetoelectric conversion characteristic in the magnetic switch. To give specific description, in the technology using the conventional two-way drive spinning current method, the magnetoelectric conversion characteristic in the magnetic switch may not always be line-symmetric between the S-pole side and the N-pole side.

In the technology using the conventional two-way drive spinning current method, different absolute values of the offset voltage of the Hall element between current drive directions causes the offset voltage to remain. The remaining offset voltage causes the magnetoelectric conversion characteristic of the magnetic switch to become asymmetric. Accordingly, in the technology using the conventional two-way drive spinning current method, a magnetoelectric conversion characteristic having a satisfactory symmetric property may not be able to be obtained.

SUMMARY OF THE INVENTION

In view of the above-mentioned circumstances, an object of the present invention is to provide a semiconductor device capable of stably ensuring a symmetric property of a magnetoelectric conversion characteristic through use of a two-way drive spinning current method.

According to at least one embodiment of the present invention, there is provided a semiconductor device including a magnetic switch provided to a semiconductor substrate, the magnetic switch including a Hall element including a first electrode and a second electrode which are arranged on a first straight line; and a third electrode and a fourth electrode which are arranged on a second straight line perpendicular to the first straight line; a first switch circuit including a plurality of switches, the first switch circuit being configured to select one direction as a direction of a drive current of the Hall element from four directions of a first direction from the first electrode to the second electrode, a second direction from the second electrode to the first electrode, a third direction from the third electrode to the fourth electrode, and a fourth direction from the fourth electrode to the third electrode; a comparison circuit configured to alternately perform a first operation for sampling a signal transmitted from the Hall element and a second operation for sending a result signal which is based on a result of comparing a reference value and a value of a difference signal between the signal transmitted from the Hall element and the signal sampled by the first operation; a latch circuit configured to hold the result signal sent from the comparison circuit, and send the held result signal as a latch output signal; and a control circuit configured to select one mode based on the latch output signal from a first mode of controlling open/closed states of the plurality of switches so as to cause the drive current to flow in the third direction in a first period for performing the first operation and flow in the first direction in a second period for performing the second operation; and a second mode of controlling open/closed states of the plurality of switches so as to cause the drive current to flow in the second direction in the first period and flow in the fourth direction in the second period.

According to at least one aspect of the present invention, it is possible to provide the semiconductor device capable of stably ensuring the symmetric property of the magnetoelectric conversion characteristic through use of the two-way drive spinning current method.

BRIEF DESCRIPTION OF THE DRAWINGS

FIG. 4 is an explanatory table for showing an example of control logic patterns of a logic circuit in the control circuit.

DETAILED DESCRIPTION OF THE PREFERRED EMBODIMENTS

A semiconductor device according to each of embodiments of the present invention is described with reference to the accompanying drawings. The semiconductor device according to each of the embodiments includes a magnetic switch provided to a semiconductor substrate. In the description, a conversion characteristic from a magnetic flux density acting on the semiconductor substrate to an analog signal is referred to as "magnetoelectric conversion characteristic," and a conversion characteristic from the magnetic flux density to a logical signal is referred to as "magnetoelectric conversion switching characteristic." In the following description, like components are denoted by like reference symbols.

First Embodiment

Figure 1:
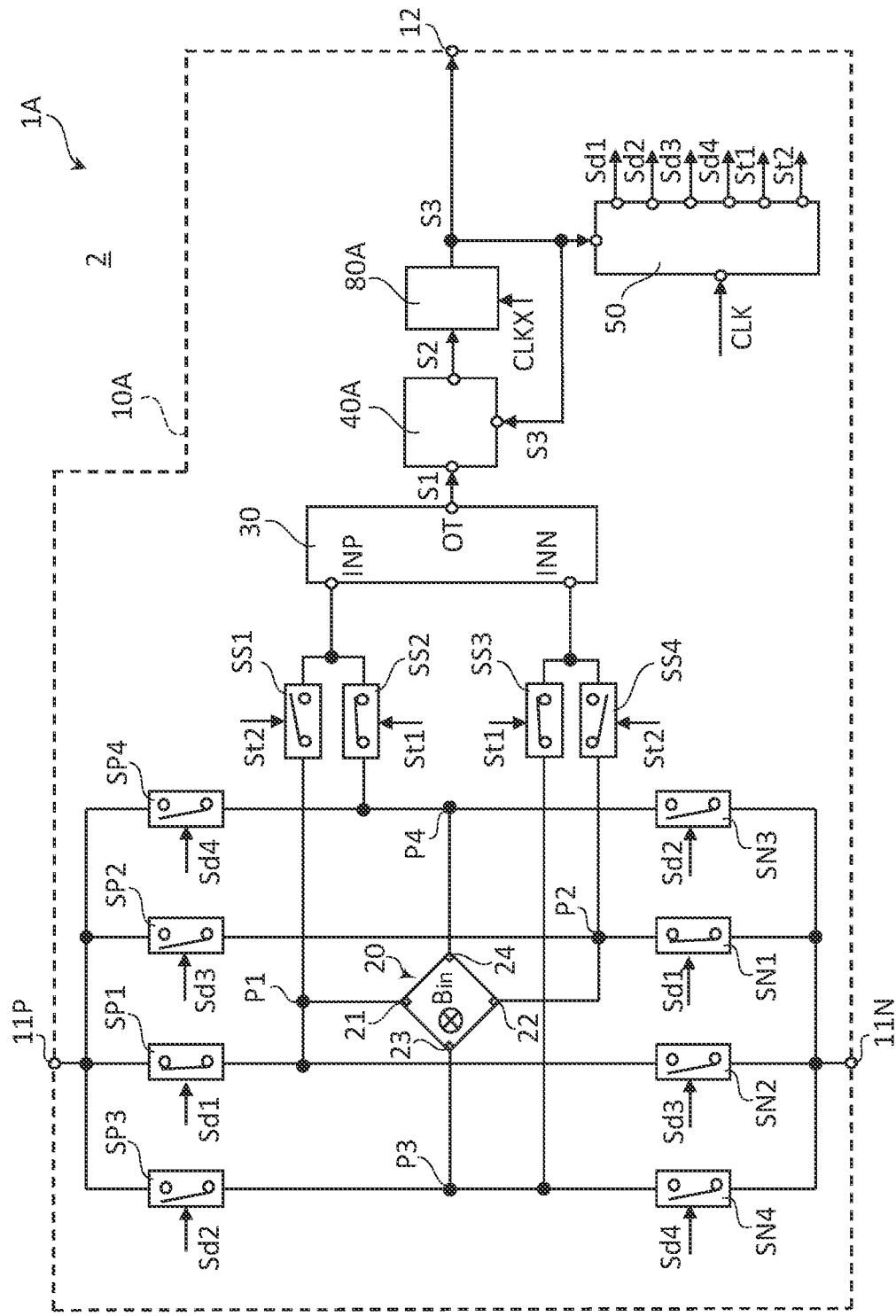
FIG. 1 is a schematic diagram of a semiconductor device according to a first embodiment of the present invention.

FIG. 1 is a schematic diagram for illustrating a configuration of a semiconductor device 1A according to a first embodiment of the present invention.

The semiconductor device 1A includes a magnetic switch 10A provided to a semiconductor substrate 2. The magnetic switch 10A includes drive terminals 11P and 11N, an output terminal 12, a horizontal Hall element 20, switches SP1 to SP4 and SN1 to SN4 serving as a first switch circuit, switches SS1 to SS4, an amplifier 30, a sample-and-hold comparator (hereinafter referred to as "SH comparator") 40A serving as a comparison circuit, a control circuit 50, and a latch circuit 80A.

Figure 5A:
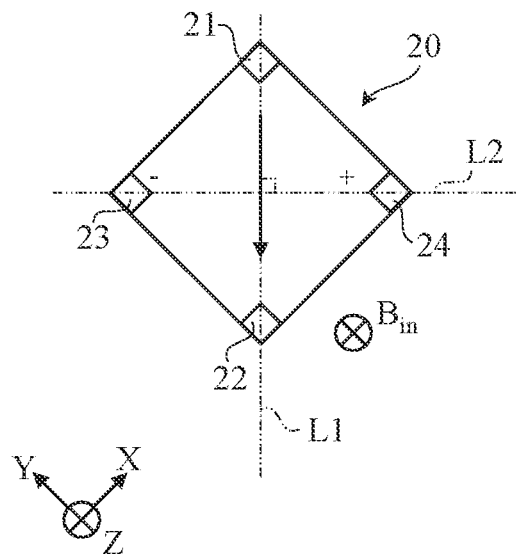
FIGS. 5A, 5B, 5C, and 5D are explanatory diagrams for each illustrating a direction of a drive current of a horizontal Hall element in the semiconductor device according to the first embodiment.
Figure 5B:
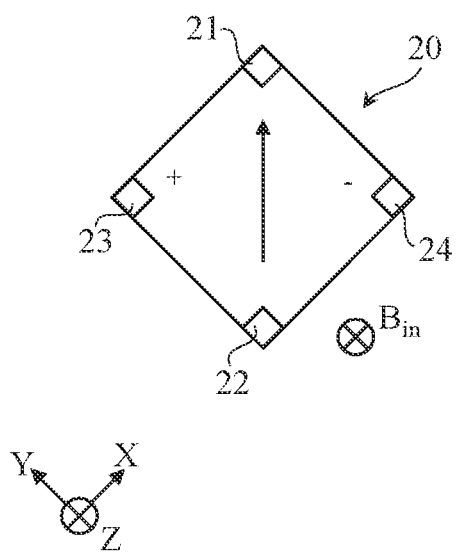
Figure 5C:
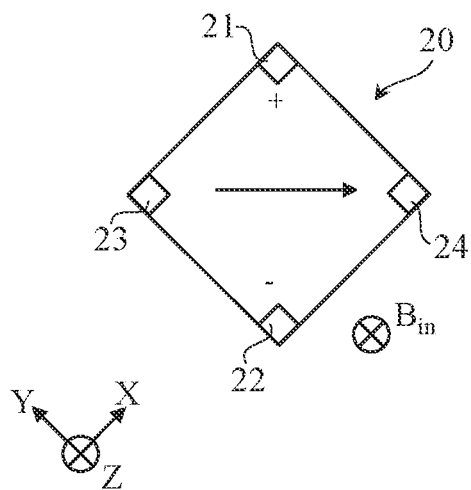
Figure 5D:
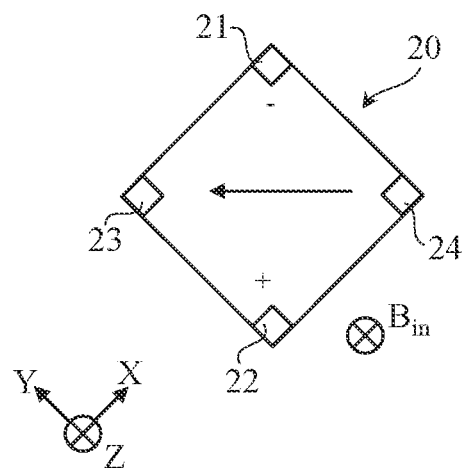

The horizontal Hall element 20 is a magnetic detection element including electrodes 21 to 24 and being configured to obtain an output corresponding to a magnetic flux density Bin perpendicular to the semiconductor substrate 2. The electrodes 21 to 24 are provided to a resistor formed of an impurity diffusion layer and a well layer of the semiconductor substrate 2. As described later, the electrodes 21 to 24 are arranged in such a position that a first straight line L1 passing through the electrodes 21 and 22 as illustrated in FIG. 5A and a second straight line L2 passing through the electrodes 23 and 24 as illustrated in FIG. 5A are perpendicular to each other. In other words, the electrode 21 serving as a first electrode and the electrode 22 serving as a second electrode are arranged on the first straight line L1. The electrode 23 serving as a third electrode and the electrode 24 serving as a fourth electrode are arranged on the second straight line L2.

Each of the switches SP1 to SP4, SN1 to SN4, and SS1 to SS4 includes a first terminal and a second terminal provided at both ends of an openable and closable electric circuit path and an opening/closing control terminal serving as a control terminal. The switches SP1 to SP4, SN1 to SN4, and SS1 to SS4 are each configured to be switchable between an open state (open) of a path being opened and a closed state (short circuit) of a path being closed depending on a level of a control signal supplied from the opening/closing control terminal. The switches SP1 to SP4, SN1 to SN4, and SS1 to SS4 are each controlled to be in a closed state at a high (hereinafter referred to simply as "H") level of the control signal supplied from the opening/closing control terminal and to be in an open state at a low (hereinafter referred to simply as "L") level of the control signal.

The amplifier 30 is formed of a differential amplifier circuit including a positive phase input terminal INP, a negative phase input terminal INN, and an output terminal OT. The positive phase input terminal INP and the negative phase input terminal INN are each configured to receive a signal transmitted from the horizontal Hall element 20. The output terminal OT is configured to amplify and send a difference between the two signals supplied from the positive phase input terminal INP and the negative phase input terminal INN.

As described later specifically, the SH comparator 40A includes an input terminal 41, an input terminal 42, an input terminal 44, and an output terminal 43. The input terminal 41 is configured to receive a signal S1 sent from the amplifier 30. The input terminal 42 is configured to receive a signal S3 fed back from the latch circuit 80A, The input terminal 44 is configured to receive a reference clock signal CLK. The output terminal 43 is configured to send a signal.

As described later specifically, the control circuit 50 includes an input terminal 51a, an input terminal 51b, output terminals 56a to 56d, and output terminals 56e and 56E The input terminal 51a is configured to receive the reference clock signal CLK. The input terminal 51b is configured to receive the signal S3. The output terminals 56a to 56d are configured to send drive control signals Sd1 to Sd4, respectively, as control signals. The output terminals 56e and 56f are configured to send transmission control signals St1 and St2, respectively.

The latch circuit 80A includes a signal input terminal, an inverted clock input terminal, an output terminal, and a latch output signal generator (not shown). The signal input terminal is configured to receive a signal S2, The inverted clock input terminal is configured to receive a negative phase reference clock signal CLKX being a signal having a phase reverse to that of the reference clock signal CLK. The output terminal is configured to send the signal S3 as a latch output signal. The latch output signal generator is configured to generate the signal S3 based on the signal S2 and the negative phase reference clock signal CLKX. The latch circuit 80A is configured to perform so-called data latching.

The drive terminal 11P serving as a first drive terminal is connected to a first power source (not shown) configured to supply a power source voltage VDD. The drive terminal 11P is also connected to each of the first terminals of the switches SP1 to SP4.

The second terminal of the switch SP1 as a first switch is connected to the first terminal of the switch SN2 as a sixth switch, the electrode 21, and the first terminal of the switch SS1 A connection point among those components is formed as a node P1.

The second terminal of the switch SP2 as a fifth switch is connected to the first terminal of the switch SN1 as a second switch, the electrode 22, and the first terminal of the switch 554. A connection point among those components is formed as a node P2.

The second terminal of the switch SP3 as a third switch is connected to the first terminal of the switch SN4 as an eighth switch, the electrode 23, and the first terminal of the switch SS3, A connection point among those components is formed as a node P3.

The second terminal of the switch SP4 as a seventh switch is connected to the first terminal of the switch SN3 as a fourth switch, the electrode 24, and the first terminal of the switch 552. A connection point among those components is formed as a node P4.

Each of the second terminals of the switches SN1 to SN4 is connected to the drive terminal 11N serving as a second drive terminal. The drive terminal 11N is connected to a second power source (not shown) configured to supply a power source voltage VSS.

The second terminals of the switches SS1 and SS2 are connected to the positive phase input terminal INP of the amplifier 30. The second terminals of the switches SS3 and SS4 are connected to the negative phase input terminal INN of the amplifier 30.

The output terminal OT of the amplifier 30 is connected to the input terminal 41 of the SH comparator 40A. The output terminal 43 of the SH comparator 40A is connected to the signal input terminal of the latch circuit 80A. The output terminal of the latch circuit 80A is connected to the output terminal 12 of the magnetic switch 10A, the input terminal 51b of the control circuit 50, and the input terminal 42 of the SH comparator 40A.

Configurations of the SH comparator 40A and the control circuit 50 are further described.

Figure 2:
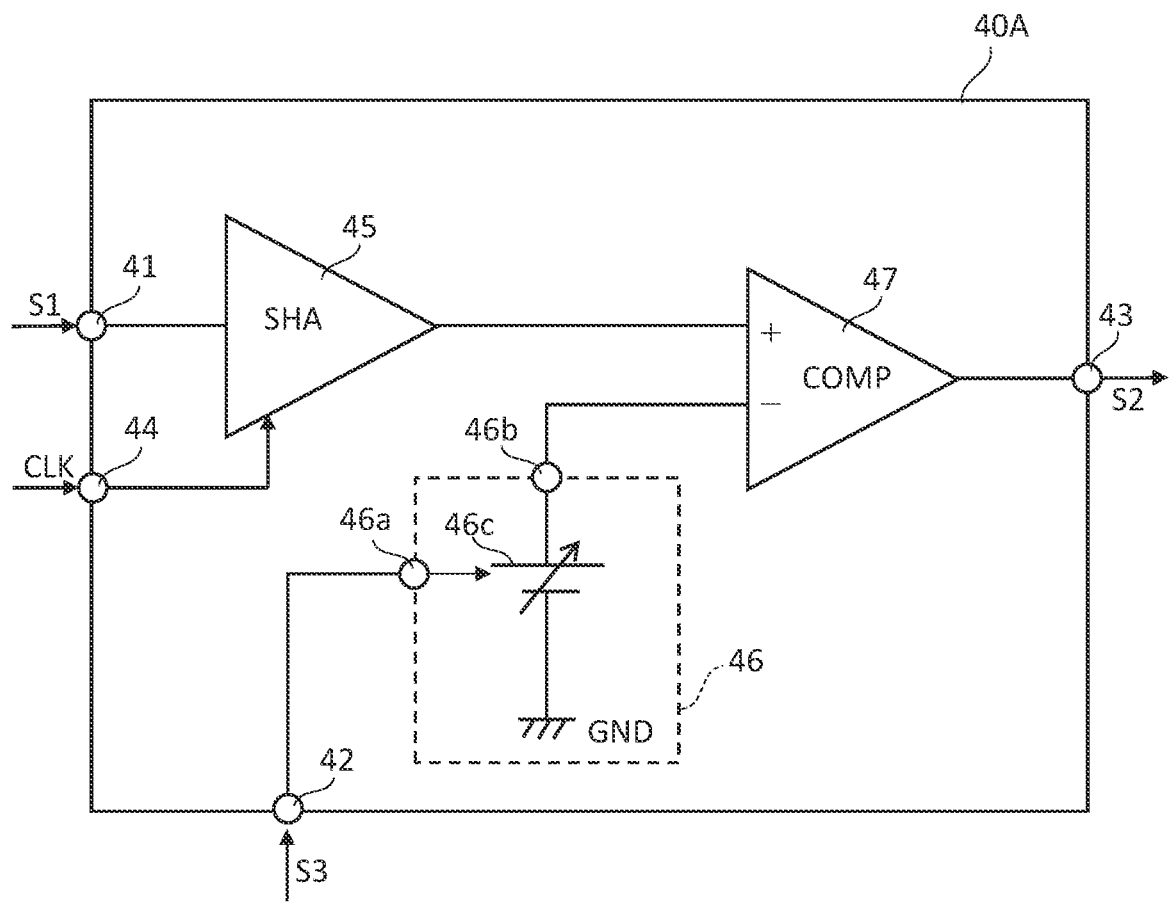
FIG. 2 is a circuit diagram for illustrating an example of a sample-and-hold comparator in the semiconductor device according to the first embodiment.

FIG. 2 is a circuit diagram for illustrating the SH comparator 40A.

The SH comparator 40A includes the input terminals 41, 42, and 44, a sample-and-hold amplifier (hereinafter, referred to as "SHA") 45, a reference voltage circuit 46, a comparator 47, and the output terminal 43.

The SHA 45 contains a first input terminal connected to the input terminal 41, a second input terminal connected to the input terminal 44, and an output terminal. The reference voltage circuit 46 contains an input terminal 46a connected to the input terminal 42, an output terminal 46b, and a variable voltage source 46c. The variable voltage source 46c includes a first terminal connected to the output terminal 46b and a second terminal connected (grounded) to GND. The comparator 47 includes a non-inverting input terminal connected to the output terminal of the SHA 45, an inverting input terminal connected to the output terminal 46b, and an output terminal connected to the output terminal 43.

Figure 3:
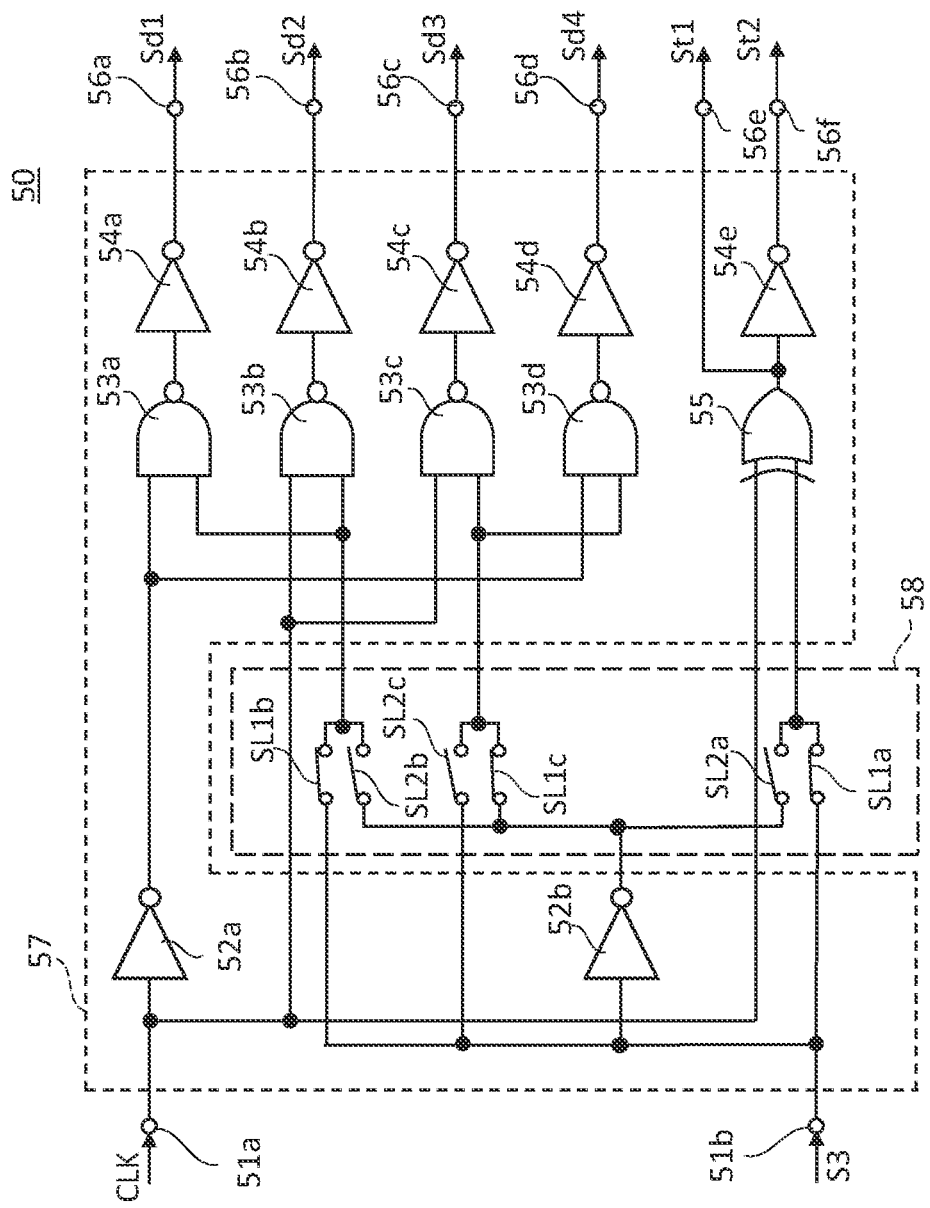
FIG. 3 is a circuit diagram for illustrating an example of a control circuit in the semiconductor device according to the first embodiment.

FIG. 3 is a circuit diagram for illustrating an example of the control circuit 50. FIG. 4 is an explanatory table for showing an example of control logic patterns of a logic circuit 57 in the control circuit 50.

The control circuit 50 includes: input terminals 51a and 51b; the logic circuit 57 and a switch circuit 58 serving as a control signal generation circuit; the output terminals 56a to 56d serving as a first control signal output terminal to a fourth control signal output terminal, respectively; and the output terminals 56e and 56f.

The control circuit 50 is configured to be able to generate six control signals, namely, the drive control signals Sd1 to Sd4 serving as four control signals and the transmission control signals St1 and St2 being two control signals, based on the reference clock signal CLK supplied from the input terminal 51a and the signal S3 supplied from the input terminal 51b. The reference clock signal CLK is a periodic signal having a period TC as one cycle period. The period TC is a total period of a first period Φ1 at an H level and a second period Φ2 at an L level.

The drive control signals Sd1 to Sd4 are sent from the output terminals 56a to 56d, respectively. The transmission control signals St1 and St2 are sent from the output terminals 56e and 56f, respectively.

The logic circuit 57 includes two input terminals connected to the input terminals 51a and 51b, respectively, six output terminals connected to the output terminals 56a to 56f, respectively, and a plurality of logical operation elements configured to connect the two input terminals to the six output terminals. The logic circuit 57 is configured to be able to send control signals, namely, the drive control signals Sd1 to Sd4 and the transmission control signals St1 and St2, at the L level or the H level based on at least one of a first control logic pattern and a second control logic pattern shown in FIG. 4.

The plurality of logical operation elements include, for example, inverters 52a, 52b, and 54a to 54e, NAND elements 53a to 53d, and an EXOR element 55. The plurality of logical operation elements form, together with the switch circuit 58, a path capable of transmitting a signal between the input terminals 51a and 51b and the output terminals 56a to 56f.

The input terminals of the inverter 52a, the NAND elements 53b and 53c, and the EXOR element 55 are connected to the input terminal 51a. Meanwhile, the input terminal of the inverter 52b is connected to the input terminal 51b. Of first input terminals and second input terminals, the second input terminals of the NAND elements 53a to 53d and the EXOR element 55 are connected to the input terminal 51b through the switch circuit 58 or through the inverter 521 and the switch circuit 58.

The switch circuit 58 serving as a second switch circuit includes a pair of switches SL1a and SL2a, a pair of switches SL1b and SL2b, and a pair of switches SL1c and SL2c. The open/closed states of the switches forming each of the above-described pairs are different from each other. A closed state of one of the pairs, namely, each of the switches SL1a, SL1b, and SL1c, brings the other one of the pairs, namely, each of the switches SL2a, SL2b, and SL2c, into an open state. Meanwhile, an open state of one of the pairs, namely, each of the switches SL1a, SL1b, and SL1c, brings the other one of the pairs, namely, each of the switches SL2a, SL2b, and SL2c, into a closed state.

The closed states of the switches SL1a, SL1b, and SL1c and the open states of the switches SL2a, SL2b, and SL2c bring the second input terminals of the NAND elements 53a to 53d and the EXOR element 55 into connection to the input terminal 51b through a first path. The open states of the switches SL1a, SL1b, and SL1c and the closed states of the switches SL2a, SL2b, and SL2c bring the second input terminals of the NAND elements 53a to 53d and the EXOR element 55 into connection to the input terminal Sib through a second path different from the first path.

A pattern of a control logic exhibited with the second input terminals of the NAND elements 53a to 53d and the EXOR element 55 being connected to the input terminal 51b through the first path corresponds to the first control logic pattern. Meanwhile, a pattern of a control logic exhibited with the second input terminals of the NAND elements 53a to 53d and the EXOR element 55 being connected to the input terminal 51b through the second path corresponds to the second control logic pattern.

Next, an action of the magnetic switch 10A is described.

FIGS. 5A through 5D are explanatory diagrams for each illustrating a direction of a drive current defined in the horizontal Hall element 20.

The magnetic switch 10A is configured so as to be able to select any one of four directions of the drive current of the horizontal Hall element 20 via the switches SP1 to SP4 and SN1 to SN4. It is possible to appropriately switch the direction of the drive current of the horizontal Hall element 20 by causing the control circuit 50 to control the open/closed states of the switches SP1 to SP4 and SN1 to SN4. In the following, for the sake of convenience in description, the direction from the electrode 21 to the electrode 22 is referred to as "first direction," and the direction from the electrode 22 to the electrode 21 is referred to as "second direction." In the same manner, the direction of the drive current from the electrode 23 to the electrode 24 is referred to as "third direction," and the direction thereof from the electrode 24 to the electrode 23 is referred to as "fourth direction."

In addition, a pair of the first direction and the third direction is referred to as "first direction pair," and a pair of the second direction and the fourth direction is referred to as "second direction pair." The straight line L1 and the straight line. L2 have a perpendicular relationship to each other. Thus, the first direction and the second direction have a perpendicular relationship to the third direction and the fourth direction, respectively. Accordingly, each of the "first direction pair" and the "second direction pair" is a pair of two directions perpendicular to each other.

The horizontal Hall element 20 is formed in parallel to an XY plane in an XYZ three-dimensional Cartesian coordinate system. Under an environment of the horizontal Hall element 20 being provided with a magnetic flux density Bin in a direction (Z-axis direction) of vertically penetrating the drawing sheet from the front to the back, a positive Hall electromotive force is generated between the electrode 24 and the electrode 23 in a case of the drive current flowing in the first direction, and a negative Hall electromotive force is generated between the electrode 24 and the electrode 23 in a case of the drive current flowing in the second direction.

In the same manner, a positive Hall electromotive force is generated between the electrode 21 and the electrode 22 in a case of the drive current flowing in the third direction, and a negative Hall electromotive force is generated between the electrode 21 and the electrode 22 in a case of the drive current flowing in the fourth direction. In general, the horizontal Hall element 20 has a certain regularity in each direction of the drive current, to thereby generate an offset voltage having an absolute value larger than that of the Hall electromotive force being the output signal of the horizontal Hall element 20.

The output signal of the horizontal Hall element 20 is transmitted from the electrodes 21 to 24 to the amplifier 30 via the switches SS1 to SS4. The switches SS1 to SS4 are controlled to open and close so that the open/closed state of the switches SS2 and SS3 and the open/closed state of the switches SS1 and SS4 are different from each other based on the transmission control signals St1 and St2.

In the case of the drive current flowing in the first direction, the switches SS2 and SS3 in the closed state and the switches SS1 and SS4 in the open state cause the electrode 23 to be connected to the negative phase input terminal INN via the switch SS3. In the case of the drive current flowing in the second direction, the open/closed states of the switches SS1 to SS4 are the same as the open/closed states of the switches SS1 to SS4 exhibited in the case of the drive current flowing in the first direction. Thus, the electrode 23 is connected to the negative phase input terminal INN via the switch SS3, and the electrode 24 is connected to the positive phase input terminal IMP via the switch SS2.

In the case of the drive current flowing in the third direction, the switches SS1 and SS4 in the closed state and the switches SS2 and SS3 in the open state cause the electrode 23 to be connected to the negative phase input terminal INN via the switch SS3. In the case of the drive current flowing in the fourth direction, the open/closed states of the switches SS1 to SS4 are the same as the open/closed states of the switches SS1 to SS4 exhibited in the case of the drive current flowing in the third direction. Thus, the electrode 23 is connected to the negative phase input terminal INN via the switch SS3, and the electrode 24 is connected to the positive phase input terminal INP via the switch SS2.

The amplifier 30 amplifies a differential input voltage $\Delta V$ between the positive phase input terminal INP and the negative phase input terminal INN at a predetermined amplification factor G, and sends the amplified signal from the output terminal OT to the SH comparator 40A, There is an input offset voltage $V_{OSA}$ in the amplifier 30, and the signal S1 sent from the output terminal OT is influenced by the input offset voltage $V_{OSA}$. The signal S1 is represented by a product of: a sum of the differential input voltage $\Delta V$ and the input offset voltage $V_{OSA}$; and the amplification factor G, that is, $(\Delta V+V_{OSA})\cdot G$. The input offset voltage $V_{OSA}$ included in the signal S1 is canceled in the process of executing a spinning current method described above.

The SH comparator 40A performs an operation for sampling the signal S1; and a comparison determination operation for comparing a difference voltage signal serving as a difference signal from the signal S1 in the immediately preceding period with a predetermined reference voltage and sending a result signal based on a result of the comparison. The sampling of the signal S1 serving as a first operation is performed by the SHA 45. The comparison determination operation serving as a second operation is performed by the comparator 47. The sampling of the signal S1 and the comparison determination operation are performed alternately.

The SH comparator 40A samples the signal S1 in the first period and performs comparison determination by comparing the difference voltage signal between the sampled signal S1 in the first period $\Phi 1$ and the signal S1 in the second period $\Phi 2$ with the predetermined reference voltage. The SH comparator 40A sends the signal S2 having a level corresponding to a result of the comparison determination between the difference voltage signal and the predetermined reference voltage. For example, the level of the signal S2 is switched based on the result of the comparison determination so as to become the L level in a case of the difference voltage signal lower than the predetermined reference voltage and to become the H level in a case of the difference voltage signal equal to or higher than the predetermined reference voltage.

The predetermined reference voltage serving as a reference value is generated by the variable voltage source 46c. The generated voltage is switched to any one of a first voltage and a second voltage different from the first voltage, depending on the signal S3 sent from the latch circuit 80A.

The offset voltages of the horizontal Hall element 20 and the amplifier 30 are canceled through use of subtraction processing between the first period $\Phi 1$ and the second period $\Phi 2$. In the SH comparator 40A, so-called auto-zero processing over the first period $\Phi 1$ and the second period $\Phi 2$ can also be executed to cancel the offset voltage of the SH comparator 40A itself.

The signal S2 is supplied from the SH comparator 40A to the latch circuit 80A, The latch circuit 80A holds a level opposite to the level of the supplied signal S2 at a last timing in the second period $\Phi 2$, that is, at a falling edge of the negative phase reference clock signal CLKX, and sends the held signal as the signal S3. Thus, the signal S3 is updated based on the level of the signal S3 for each period TC corresponding to one cycle period of the reference clock signal CLK.

Figure 6A:
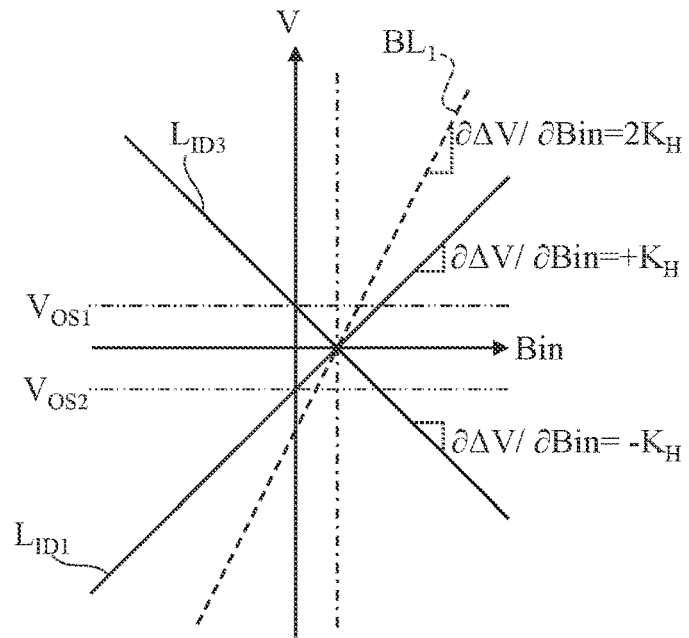
FIG. 6A is a schematic graph for showing a relationship of an input voltage of an amplifier with respect to a magnetic flux density Bin.
Figure 6B:
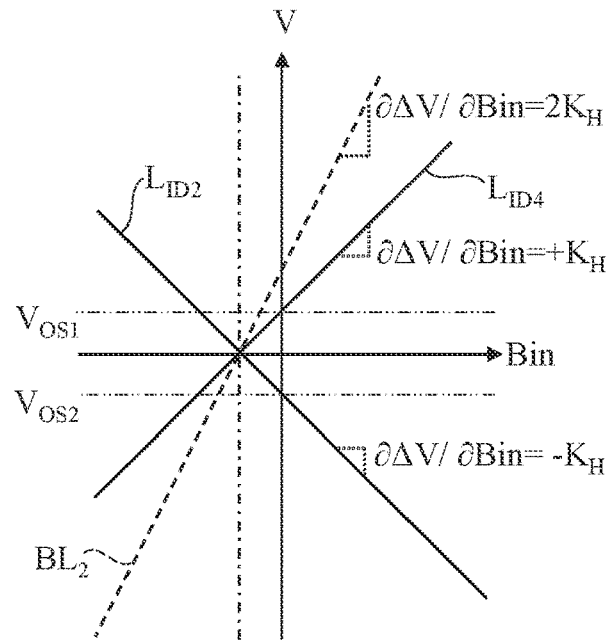
FIG. 6B is a schematic graph for showing a relationship of the input voltage of the amplifier with respect to the magnetic flux density Bin in a case of the drive current flowing through the horizontal Hall element in directions being a second direction pair.

FIG. 6A is a schematic graph for showing a relationship of the input voltage of the amplifier 30 with respect to the magnetic flux density Bin in a case of the drive current flowing through the horizontal Hall element 20 in the first direction pair (pair of the first direction and the third direction). FIG. 6B is a schematic graph for showing a relationship of the input voltage of the amplifier 30 with respect to the magnetic flux density Bin in a case of the drive current flowing through the horizontal Hall element 20 in the second direction pair (pair of the second direction and the fourth direction).

In each of FIGS. 6A and 6B, the horizontal axis represents the magnetic flux density Bin acting on the semiconductor substrate 2, and the vertical axis represents a voltage V. Solid lines $L_{ID1}$ to $L_{ID4}$ represent the differential input voltage $\Delta V$ of the amplifier 30 with respect to the magnetic flux density Bin corresponding to the first direction to the fourth direction, respectively. The differential input voltage $\Delta V$ corresponds to a voltage obtained by adding up two voltages applied from the horizontal Hall element 20, namely, one positive phase voltage and the other negative phase voltage. The differential input voltage $\Delta V$ (hereinafter referred to as "vertical axis intercept") at a time of the magnetic flux density Bin being 0 (zero) represents an offset voltage in a zero magnetic field. The slope of a straight line represents a magnetoelectric conversion coefficient. The slopes of the solid lines $L_{ID1}$ and $L_{ID4}$ are equal to a magnetoelectric conversion coefficient $K_H$ ($\partial \Delta V/\partial Bin = K_H$). The slopes of the solid lines $L_{ID2}$ and $L_{ID3}$ are equal to a magnetoelectric conversion coefficient $-K_H$ ($\partial\Delta V/\partial Bin=-K_H$).

A broken line BL1 represents a magnetoelectric conversion characteristic of a difference between an offset voltage $\Delta V1$ in the case of the drive current flowing in the first direction and an offset voltage $\Delta V3$ in the case of the drive current flowing in the third direction. A broken line BL2 represents a magnetoelectric conversion characteristic of a difference between an offset voltage $\Delta V2$ in the case of the drive current flowing in the second direction and an offset voltage $\Delta V4$ in the case of the drive current flowing in the fourth direction.

Processing for calculating the difference between the offset voltage $\Delta V1$ and the offset voltage $\Delta V3$ and processing for calculating the difference between the offset voltage $\Delta V2$ and the offset voltage $\Delta V4$ are executed by the SH comparator 40A, The slope of the broken lines MA and BL2 is a difference between the magnetoelectric conversion coefficient $K_H$ and the magnetoelectric conversion coefficient $-K_H$, and is twice the slope of the solid lines $L_{ID1}$ and $L_{ID4}$ ($=2K_H$).

In this case, an offset voltage in the case of the drive current flowing through the horizontal Hall element 20 in the first direction and the second direction is set as an offset voltage $V_{OS2}$, and an offset voltage in the case of the drive current flowing through the horizontal Hall element 20 in the third direction and the fourth direction is set as an offset voltage $V_{OS1}$. Then, the offset voltages $\Delta V1$ to $\Delta V4$ are expressed by Expressions (1) to (4), respectively.

$$\Delta V1 = +K_H \cdot B_{in} + V_{OS2} \quad (1)$$

$$\Delta V3 = -K_H \cdot B_{in} + V_{OS1} \quad (2)$$

$$\Delta V2 = -K_H \cdot B_{in} + V_{OS2} \quad (3)$$

$$\Delta V4 = +K_H \cdot B_{in} + V_{OS1} \quad (4)$$

Subsequently, a difference between the directions forming the first direction pair is expressed by Expressions (5) and (6). A difference between the directions forming the second direction pair is represented by Expressions (7) and (8).

$$\Delta V1 - \Delta V3 = +2K_H \cdot B_{in} + (V_{OS2} - V_{OS1}) \quad (5)$$

$$\Delta V3 - \Delta V1 = -2K_H \cdot B_{in} - (V_{OS2} - V_{OS1}) \quad (6)$$

$$\Delta V2 - \Delta V4 = +2K_H \cdot B_{in} + (V_{OS2} - V_{OS1}) \quad (7)$$

$$\Delta V4 - \Delta V2 = -2K_H \cdot B_{in} - (V_{OS2} - V_{OS1}) \quad (8)$$

The offset voltage is different between the directions. Thus, the influence of the offset voltage is not canceled by the subtraction processing. The difference between the directions forming the first direction pair and the difference between the directions forming the second direction pair have such a non-ideal characteristic that the vertical axis intercept is $(V_{OS2}-V_{OS1})$ or $(V_{OS1}-V_{OS2})$.

In this case, the magnetic flux density Bin (horizontal axis intercept) with the differential input voltage $\Delta V$ being zero ($\Delta V=0$) is obtained from a value "$2K_H$" of the slope. Then, the magnetic offsets $B_{OSDP1}$ and $B_{OSDP2}$ of the horizontal Hall element 20 corresponding to the first direction pair and the second direction pair can be expressed by Expressions (9) and (10), respectively.

$$B_{OSDP1} = (V_{OS2} - V_{OS1})/2K_H \quad (9)$$

$$B_{OSDP2} = (V_{OS1} - V_{OS2})/2K_H \quad (10)$$

Figure 7:
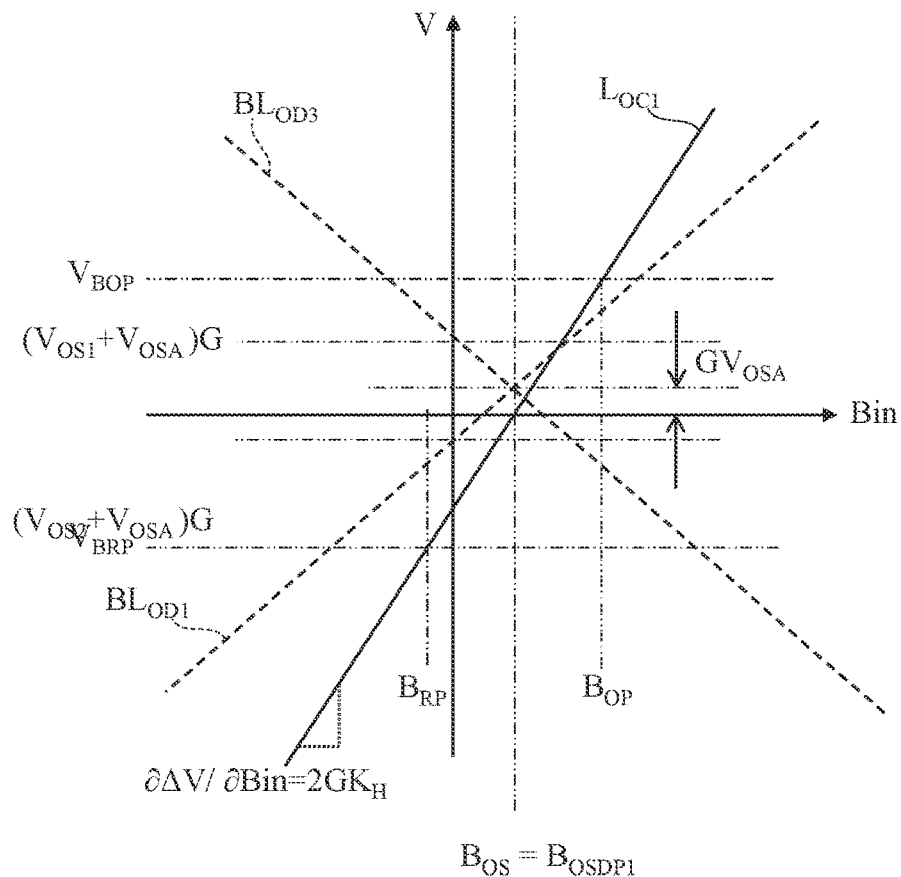
FIG. 7 is a schematic graph for showing a relationship of an output voltage of the amplifier with respect to the magnetic flux density Bin in a case of the drive current flowing through the horizontal Hall element of the semiconductor device according to the first embodiment in directions being a first direction pair.
Figure 8:
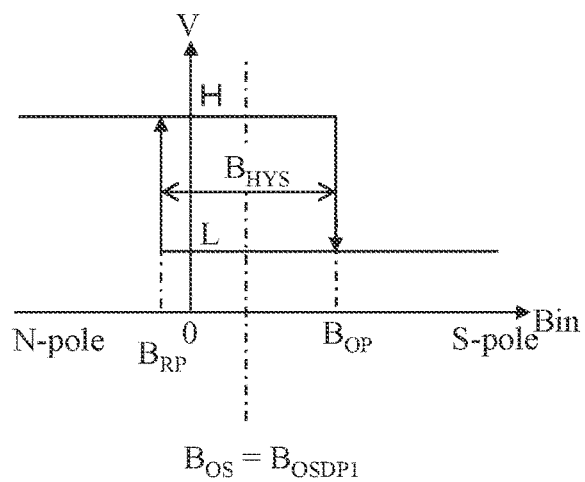
FIG. 8 is a schematic graph for showing a relationship of an output voltage of a latch circuit with respect to the magnetic flux density Bin in the case of the drive current flowing through the horizontal Hall element of the semiconductor device according to the first embodiment in the directions being the first direction pair.

FIG. 7 and FIG. 8 are each a schematic graph for showing a relationship between the signal S1 and the signal 83 with respect to the magnetic flux density Bin in the case shown in FIG. 6A, that is, in a case of the magnetic offset $B_{OSDP1}$ being positive ($B_{OSDP1}=(V_{OS2}-V_{OS1})/2K_H>0$).

Figure 9:
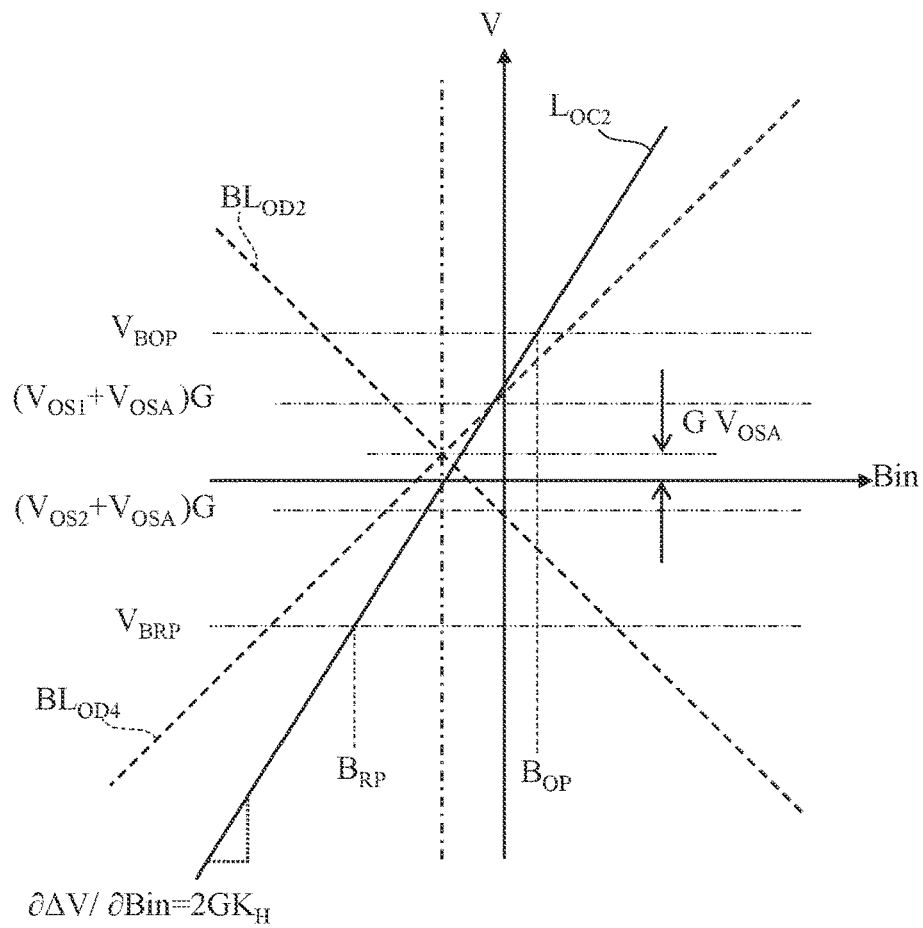
FIG. 9 is a schematic graph for showing a relationship of the output voltage of the amplifier with respect to the magnetic flux density Bin in the case of the drive current flowing through the horizontal Hall element of the semiconductor device according to the first embodiment in the directions being the second direction pair.
Figure 10:
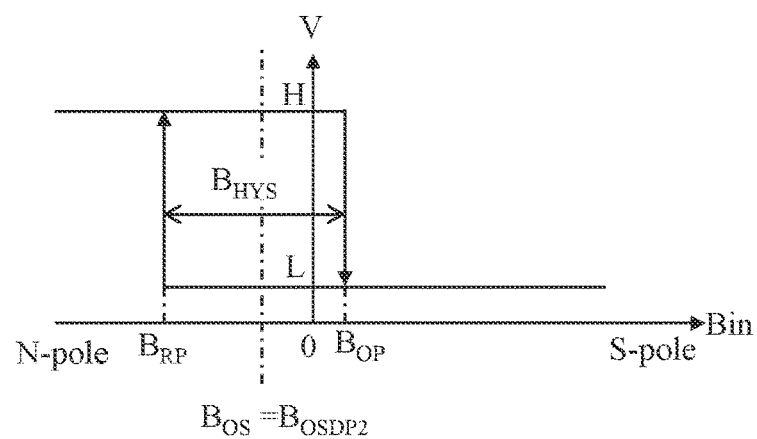
FIG. 10 is a schematic graph for showing a relationship of the output voltage of the latch circuit with respect to the magnetic flux density Bin in the case of the drive current flowing through the horizontal Hall element of the semiconductor device according to the first embodiment in the directions being the second direction pair.

FIG. 9 and FIG. 10 are each a schematic graph for showing a relationship between the signal S1 and the signal S3 with respect to the magnetic flux density Bin in the case shown in FIG. 6B, that is, in a case of the magnetic offset $B_{OSDP2}$ being negative ($B_{OSDP2}=(V_{OS1}-V_{OS2})/2K_H<0$). The broken lines $BL_{OD1}$ to $BL_{OD4}$ shown in FIG. 7 and FIG. 9 each represent the signal S1 with respect to the magnetic flux density Bin corresponding to the first direction to the fourth direction, respectively.

According to FIG. 7 and FIG. 9, the broken lines $BL_{OD1}$ to $BL_{OD4}$ are shifted in a vertical axis direction by a voltage $GV_{OS4}$ with respect to the solid lines $L_{ID1}$ to $L_{ID4}$. In this case, the voltage $GV_{OS4}$ is a product of the amplification factor G and the input offset voltage $V_{OS4}$. In the case of the magnetic offset $B_{OSDP1}$ being positive, as shown in FIG. 8, the magnetoelectric conversion switching characteristic has both an operating point $B_{OP}$ and a returning point $B_{RP}$ shifted in a positive magnetic flux density direction (rightward direction of FIG. 8). In the case of the magnetic offset $B_{OSDP2}$ being negative, as shown in FIG. 10, the magnetoelectric conversion switching characteristic has both the operating point $B_{OP}$ and the returning point $B_{RP}$ shifted in a negative magnetic flux density direction (leftward direction of FIG. 10).

It is possible to ignore the magnetic offsets $B_{OSDP1}$ and $B_{OSDP2}$ under such a condition that, in Expressions (9) and (10), $|V_{OS2}-V_{OS1}|$ is 0 or $|V_{OS2}-V_{OS1}|$ is so small that the magnetic offsets $B_{OSDP1}$ and $B_{OSDP2}$ can be ignored (this state is referred to as "substantially 0"), that is, the offset voltage $V_{OS2}$ and the offset voltage $V_{OS1}$ are equal to each other or a difference between the magnetic offsets $B_{OSDP1}$ and $B_{OSDP2}$ is small enough to be ignored (this state is referred to as "substantially the same").

However, in the semiconductor device 1A, it is not always possible to employ the Hall element with $|V_{OS2}-V_{OS1}|$ being substantially 0, In view of this, in the first embodiment, a new technology for canceling the influence of an offset voltage difference ($V_{OS2}-V_{OS1}$) without use of a so-called four-way drive signal processing is proposed.

The right-hand sides of Expressions (9) and (10) have the same absolute value and opposite signs of positive and negative signs. With attention being given to this fact, in the first embodiment, the directions of the drive current are switched between the first direction pair and the second direction pair depending on a polarity of the detected magnetic field, namely, the level of the signal S3 being the output signal of the latch circuit 80A.

In the magnetic switch 10A, in a case of not switching the direction of the drive current depending on the level of the signal S3, the operating point $B_{OP}$ and the returning point $B_{RP}$ are asymmetric with respect to the magnetic flux density Bin=0. That is, in the case of not switching the direction of the drive current depending on the level of the signal S3, the magnetic switch 10A has an asymmetric magnetoelectric conversion switching characteristic as shown in, for example, FIG. 8 and FIG. 10.

The magnetic switch 10A switches the direction of the drive current depending on the level of the signal S3, to thereby obtain the returning point $B_{RP}$ on an N-pole side obtained by inverting the operating point $B_{OP}$ on an S-pole side with respect to a straight line of Bin=0. That is, the magnetic switch 10A switches the direction of the drive current depending on the level of the signal S3, to thereby obtain a magnetoelectric conversion switching characteristic being line-symmetric with respect to the straight line of Bin=0.

Figure 11:
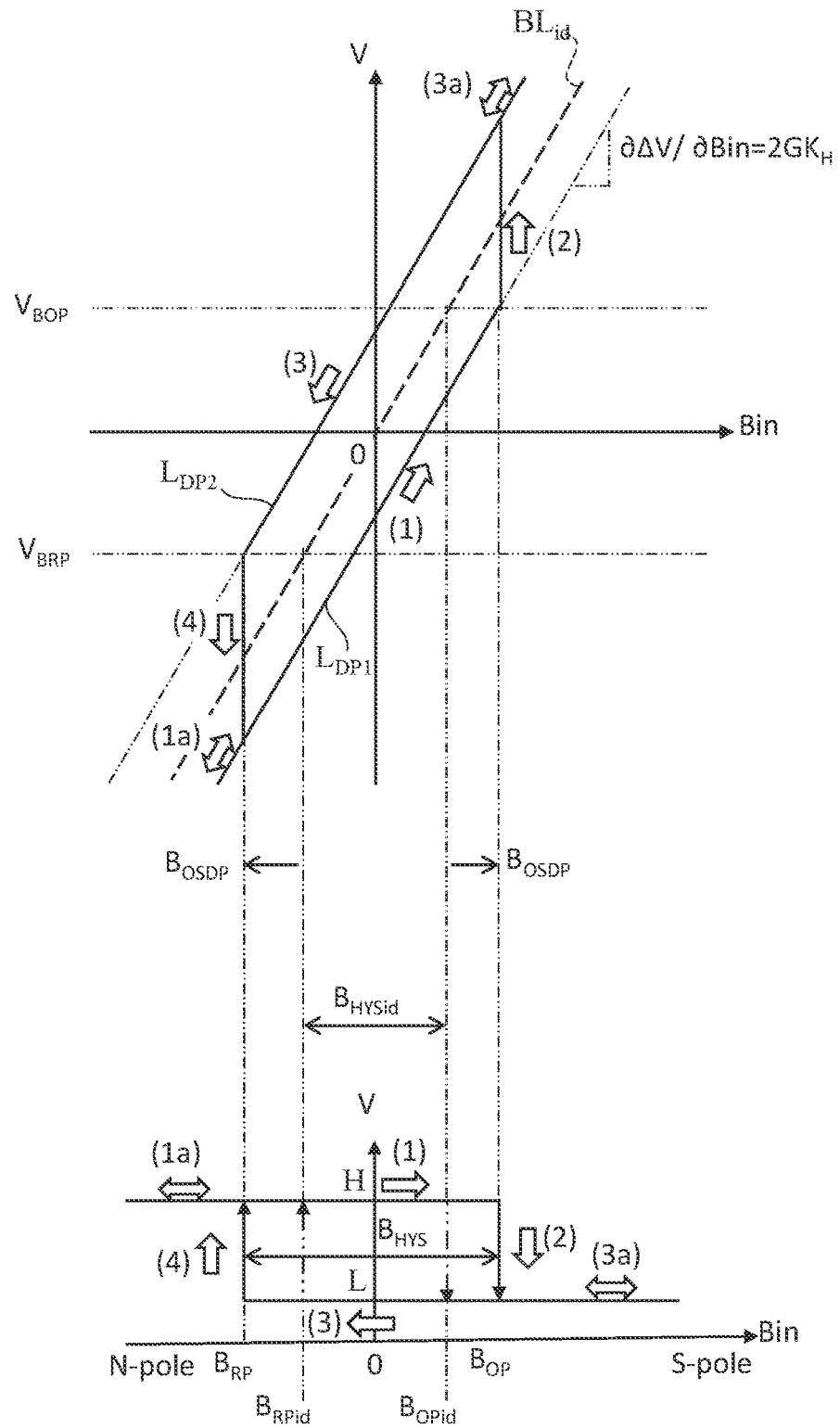
FIG. 11 is a schematic graph for showing a relationship of the output voltage of the amplifier and the output voltage of the latch circuit with respect to the magnetic flux density Bin in a case of a positive magnetic offset of the horizontal Hall element itself of the semiconductor device according to the first embodiment.

FIG. 11 is a schematic graph for showing a relationship between the signal S1 and the signal S3 with respect to the magnetic flux density Bin in a case of a magnetic offset $B_{OSDP}$ of the horizontal Hall element 20 itself being positive.

In FIG. 11, a solid line $L_{DP1}$ indicates such a magnetoelectric conversion characteristic that the magnetic offset $B_{OSDP}$ becomes positive in a case of the direction pair of the drive current being the first direction pair. A solid line $L_{DP2}$ indicates such a magnetoelectric conversion characteristic that the magnetic offset $B_{OSDP}$ becomes negative in a case of the direction pair of the drive current being the second direction pair. A broken line $BL_{id}$ indicates such an ideal magnetoelectric conversion characteristic that the magnetic offset $B_{OS}$=0. Hollow arrows (1), (1a), (2), (3), (3a), and (4) each represent a hysteresis locus of the magnetoelectric conversion characteristic.

In addition, the magnetoelectric conversion characteristic shown in FIG. 11 is an example in a case of the third direction being selected in the first period Φ1 with the signal S3 at the H level, the first direction being selected in the second period Φ2 with the signal S3 at the H level, the second direction being selected in the first period Φ1 with the signal S3 at the L level, and the fourth direction being selected in the second period Φ2 with the signal S3 at the L level. This example corresponds to the first control logic pattern.

In the first control logic pattern, the drive control signal Sd1 serving as the first control signal is sent from the output terminal 56a. In the same manner, the drive control signals Sd2, Sd3, and Sd4 serving as a second control signal, a third control signal, and a fourth control signal are sent from the output terminals 56b, 56c, and 56d, respectively. In addition, the transmission control signals St1 and St2 are sent from the output terminals 56e and 56f, respectively.

Opening and closing operations of the switches SP1 to SP4 and SN1 to SN4 and the switches SS1 to SS4 based on the drive control signals Soil to Sd4 and the transmission control signals St1 and St2 cause the third direction to be selected in the first period Φ1 with the signal S3 at the H level and cause the first direction to be selected in the second period Φ2 with the signal S3 at the H level.

In a stage of the magnetic flux density Bin increasing toward the S-pole side with the signal S3 at the H level, the locus of a magnetoelectric conversion characteristic corresponding to the solid line $L_{DP1}$ is followed (hollow arrow (1)). The signal S3 transitions to the L level at a timing of the voltage supplied to the SH comparator 40A, namely, the voltage of the signal S1 exceeding a reference voltage $V_{BOP}$ serving as the first voltage (ΔV·G>$V_{BOP}$). The reference voltage $V_{BOP}$ is a voltage with the magnetic flux density Bin at the operating point $B_{OP}$ in the magnetoelectric conversion characteristic.

In accordance with a level transition of the signal S3, the reference voltage of the SH comparator 40A is switched from the reference voltage $V_{BOP}$ to a reference voltage $V_{BRP}$ serving as the second voltage. The reference voltage $V_{BRP}$ is a voltage with the magnetic flux density Bin at the returning point $B_{RP}$ in the magnetoelectric conversion characteristic. The reference voltage $V_{BRP}$ is a voltage having an opposite sign of positive and negative signs to that of the reference voltage $V_{BOP}$.

In the case of the signal S3 at the L level, because the second direction or the fourth direction is selected as the direction of the drive current, the magnetoelectric conversion characteristic is shifted to a magnetoelectric conversion characteristic corresponding to the solid line $L_{DP2}$ (hollow arrow (2)). After that, in the case of the magnetic flux density Bin further increasing toward the S-pole side, the voltage V further increases to the positive side along the solid line $L_{DP2}$ (hollow arrow (3a)). Meanwhile, a locus at times of the magnetic flux density Bin decreasing in S-pole, becoming Bin=0, and further turning to an increase in N-pole is indicated by a hollow arrow (3). After a further increase of the magnetic flux density Bin toward the N-pole side, at a timing of the voltage supplied to the SH comparator 40A, namely, the voltage of the signal S1 exceeding the reference voltage $V_{BRP}$ to the negative side (ΔV·G<$V_{BRP}$), the signal S3 transitions to the H level. In accordance with the level transition of the signal S3, the reference voltage of the SH comparator 40A is switched from the reference voltage $V_{BRP}$ to the reference voltage $V_{BOP}$.

In the case of the signal S3 at the H level, because the third direction or the first direction is selected as the direction of the drive current, the magnetoelectric conversion characteristic is shifted to a magnetoelectric conversion characteristic corresponding to the solid line $L_{DP1}$ (hollow arrow (4)). After that, in the case of the magnetic flux density Bin further increasing toward the N-pole side, the voltage V further increases to the negative side along the solid line $L_{DP1}$ (hollow arrow (1a)). Meanwhile, a locus at times of the magnetic flux density Bin decreasing in N-pole, becoming Bin=0, and further turning to an increase in S-pole is indicated by the above-mentioned hollow arrow (1), In the first embodiment, a shape of the hysteresis locus in the magnetoelectric conversion characteristic becomes a parallelogram shape.

The magnetic switch 10A transitions between the magnetoelectric conversion characteristic corresponding to the solid line $L_{DP1}$ and the magnetoelectric conversion characteristic corresponding to the solid line $L_{DP2}$. In the above-described case of the magnetic offset $B_{OSDP}$ of the horizontal Hall element 20 itself being positive, the drive currents in the third direction and the first direction are used at a time of the magnetic flux density Bin changing in a direction of increasing toward the S-pole side. Meanwhile, the drive currents in the second direction and the fourth direction are used at a time of the magnetic flux density Bin changing in a direction of increasing toward the N-pole side. Thus, the operating point $B_{OP}$ is shifted from its design value (hereinafter referred to as "operating point design value") $B_{OPid}$ toward a low sensitivity side (direction away from Bin=0) by an amount of the magnetic offset $B_{OSDP}$. The returning point $B_{RP}$ is also shifted from its design value (hereinafter referred to as "returning point design value") $B_{RPid}$ toward the low sensitivity side by the amount of the magnetic offset $B_{OSDP}$.

In the case of the magnetic offset $B_{OSDP}$ of the horizontal Hall element 20 itself being positive, Expressions (11) to (16) are established. In this case, $B_{HYS}$, $B_{HYSid}$, and $B_{OS}$ are a hysteresis width, a design value of the hysteresis width $B_{HYS}$, and a magnetic offset on the magnetoelectric conversion switching characteristic of the magnetic switch 10A, respectively.

$$B_{OP}=B_{OPid}+B_{OSDP} \qquad (11)$$

$$B_{RP}=B_{RPid}-B_{OSDP} \qquad (12)$$

$$B_{HYS}=B_{HYSid}+2B_{OSDP} \qquad (13)$$

$$B_{OS}=(B_{OP}+B_{RP})/2=0 \qquad (14)$$

$$B_{OPid}=V_{BOP}/(2GK_H) \qquad (15)$$

$$B_{RPid}=V_{BRP}/(2GK_H) \qquad (16)$$

In accordance with Expression (11) and Expression (12), absolute values of deviation amounts from the operating point design value $B_{OPid}$ and the returning point design value $B_{RPid}$ being the design values of the operating point $B_{OP}$ and the returning point $B_{RP}$, respectively, are equal to $B_{OSDP}$, and the operating point $B_{OP}$ and the returning point $B_{RP}$ have opposite signs. Thus, the magnetic switch 10A operates so as to have sensitivities seemingly shifted at both the S-pole and the N-pole while ensuring a symmetric property of the magnetoelectric conversion switching characteristic. In the above-described case of the magnetic offset $B_{OSDP}$ of the horizontal Hall element 20 itself being positive, the magnetic switch 10A operates so as to have sensitivities seemingly deviated to low sensitivities at both the S-pole and the N-pole.

Figure 12:
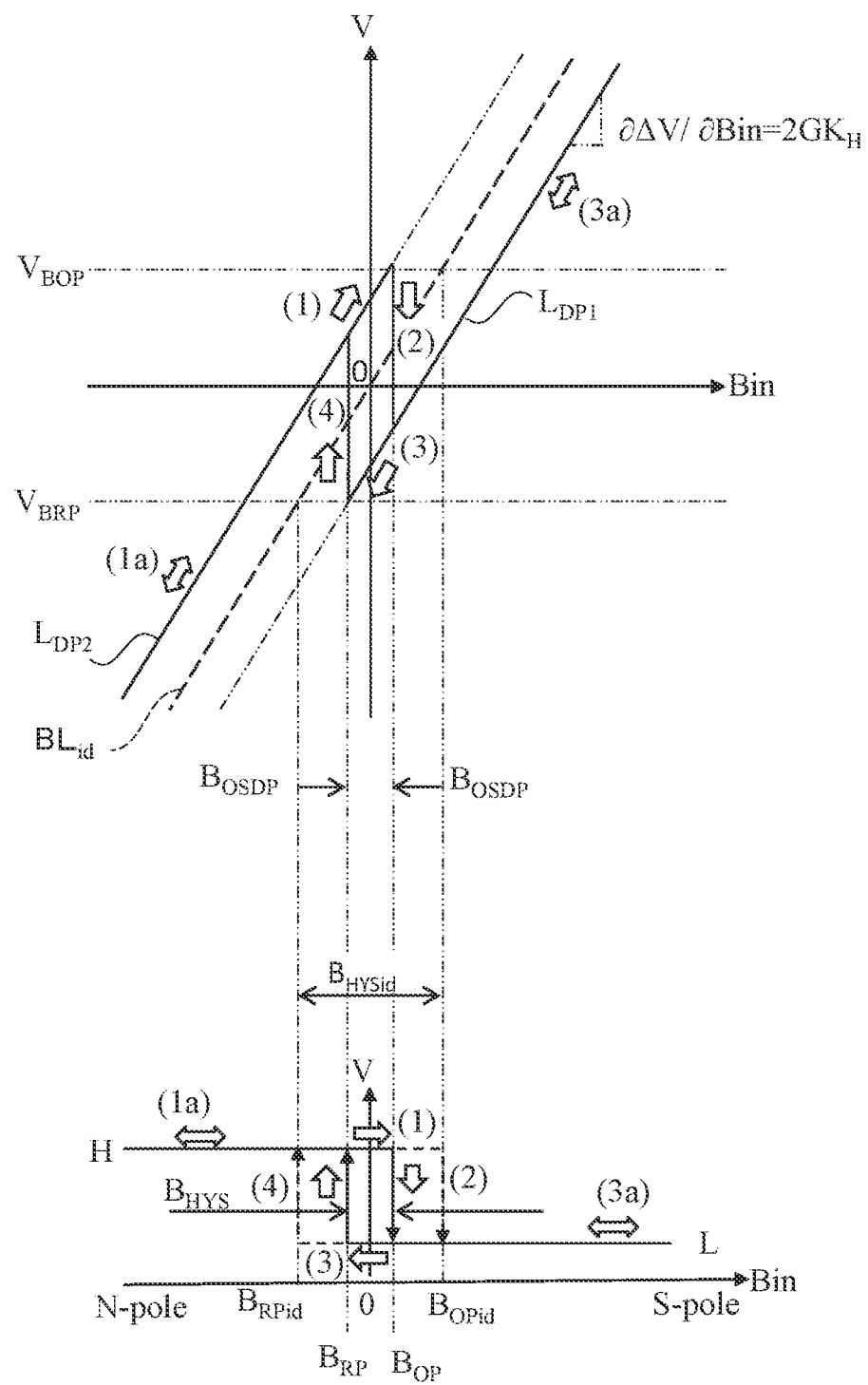
FIG. 12 is a schematic graph for showing a relationship of the output voltage of the amplifier and the output voltage of the latch circuit with respect to the magnetic flux density Bin in a case of a negative magnetic offset of the horizontal Hall element itself of the semiconductor device according to the first embodiment.

FIG. 12 is a schematic graph for showing a relationship between the signal S1 and the signal S3 with respect to the magnetic flux density Bin in a case of a magnetic offset $B_{OSDP}$ of the horizontal Hall element 20 itself being negative.

In FIG. 12, the solid line $L_{DP1}$, the solid line $L_{DP2}$, the broken line $BL_{id}$, and the hollow arrows (1), (1a), (2), (3), (3a), and (4) are the same as those shown in FIG. 11. In addition, the magnetoelectric conversion characteristic shown in FIG. 12 is an example in a case of the second direction being selected in the first period Φ1 with the signal S3 at the H level, the fourth direction being selected in the second period Φ2 with the signal S3 at the H level, the third direction being selected in the first period Φ1 with the signal S3 at the L level, and the first direction being selected in the second period Φ2 with the signal S3 at the L level. This example corresponds to the second control logic pattern.

In the second control logic pattern, the drive control signal Sd1 serving as a fifth control signal is sent from the output terminal 56a. In the same manner, the drive control signals Sd2, Sd3, and Sd4 serving as a sixth control signal, a seventh control signal, and an eighth control signal are sent from the output terminals 56b, 56c, and 56d, respectively. In addition, the transmission control signals St1 and St2 are sent from the output terminals 56e and 56f, respectively.

The opening and closing operations of the switches SP1 to SP4 and SN1 to SN4 and the switches SS1 to SS4 based on the drive control signals Sd1 to Sd4 and the transmission control signals St1 and St2 cause the second direction to be selected in the first period Φ1 with the signal S3 at the H level, cause the fourth direction to be selected in the second period Φ2 with the signal S3 at the H level, cause the first direction to be selected in the first period Φ1 with the signal S3 at the L level, and cause the third direction to be selected in the second period Φ2 with the signal S3 at the L level.

In the stage of the magnetic flux density Bin increasing toward the S-pole side with the signal S3 at the H level, the locus of a magnetoelectric conversion characteristic corresponding to the solid line $L_{DP2}$ is followed (hollow arrow (1)). The signal S3 transitions to the level at the timing of the voltage supplied to the SH comparator 40A, namely, the voltage of the signal St exceeding the reference voltage $V_{BOP}$ ($\Delta V \cdot G > V_{BOP}$). In accordance with the level transition of the signal S3, the reference voltage of the SH comparator 40A is switched from the reference voltage $V_{BOP}$ to the reference voltage $V_{BRP}$.

In the case of the signal S3 at the L level, because the third direction or the first direction is selected as the direction of the drive current, the magnetoelectric conversion characteristic is shifted to a magnetoelectric conversion characteristic corresponding to the solid line Lop: (hollow arrow (2)). After that, in the case of the magnetic flux density Bin further increasing toward the S-pole side, the voltage V further increases to the positive side along the solid line $L_{DP1}$ (hollow arrow (3a)).

Meanwhile, the locus at times of the magnetic flux density Bin decreasing in the S-pole, becoming Bin=0, and further turning to an increase in the N-pole is indicated by the hollow arrow (3). After a further increase of the magnetic flux density Bin toward the N-pole side, at the timing of the voltage supplied to the SH comparator 40A, namely, the voltage of the signal S1 exceeding the reference voltage $V_{BRP}$ to the negative side ($\Delta V \cdot G < V_{BRP}$), the signal S3 transitions to the H level. In accordance with the level transition of the signal S3, the reference voltage of the SH comparator 40A is switched from the reference voltage $V_{BRP}$ to the reference voltage $V_{BOP}$.

In the case of the signal S3 at the H level, because the second direction or the fourth direction is selected as the direction of the drive current, the magnetoelectric conversion characteristic is shifted to a magnetoelectric conversion characteristic corresponding to the solid line $L_{DP2}$ (hollow arrow (4)). After that, in the case of the magnetic flux density Bin further increasing toward the N-pole side, the voltage V further increases to the negative side along the solid line $L_{DP2}$ (hollow arrow (1a)). Meanwhile, a locus at times of the magnetic flux density Bin decreasing in N-pole, becoming Bin=0, and further turning to an increase in S-pole is indicated by the above-mentioned hollow arrow (1).

The magnetic switch 10A transitions between the magnetoelectric conversion characteristic corresponding to the solid line $L_{DP1}$ and the magnetoelectric conversion characteristic corresponding to the solid line $L_{DP2}$. In the above-described case of the magnetic offset $B_{OSDP}$ of the horizontal Hall element 20 itself being negative, the drive currents in the second direction and the fourth direction are used at the time of the magnetic flux density Bin changing in the direction of increasing toward the S-pole side.

Meanwhile, the drive currents in the third direction and the first direction are used at the time of the magnetic flux density Bin changing in the direction of increasing toward the N-pole side. Thus, the operating point $B_{OP}$ is shifted from the operating point design value Bond toward a high sensitivity side (direction approaching Bin=0) by the amount of the magnetic offset $B_{OSDP}$. The returning point $B_{RP}$ is also shifted from the returning point design value $B_{RPid}$ toward the high sensitivity side by the amount of the magnetic offset $B_{OSDP}$.

In the above-described case of the magnetic offset $B_{OSDP}$ of the horizontal Hall element 20 itself being negative, Expressions (17) to (19) are established. The magnetic offset $B_{OS}$ on the magnetoelectric conversion switching characteristic is the same as in Expression (14), that is, 0.

$$B_{OP}=B_{OPid}-B_{OSDP} \qquad (17)$$

$$B_{RP}=B_{RPid}+B_{OSDP} \qquad (18)$$

$$B_{HYS}=B_{HYSid}-2B_{OSDP} \qquad (19)$$

In accordance with Expression (17) and Expression (18), the absolute values of the deviation amounts from the operating point design value $B_{OPid}$ and the returning point design value $B_{RPid}$ being the design values of the operating point $B_{OP}$ and the returning point $B_{RP}$, respectively, are equal to $B_{OSDP}$, and the operating point $B_{OP}$ and the returning point $B_{RP}$ have opposite signs. Thus, the magnetic switch 10A operates so as to have sensitivities seemingly shifted at both the S-pole and the N-pole while ensuring the symmetric property of the magnetoelectric conversion switching characteristic. In the above-described case of the magnetic offset $B_{OSDP}$ of the horizontal Hall element 20 itself being negative, the magnetic switch 10A operates so as to have sensitivities seemingly deviated to high sensitivities at both the S-pole and the N-pole.

Next, a relationship between the magnetic flux density Bin and a magnetic detection state indicated by the signal S3 is described.

Figure 13:
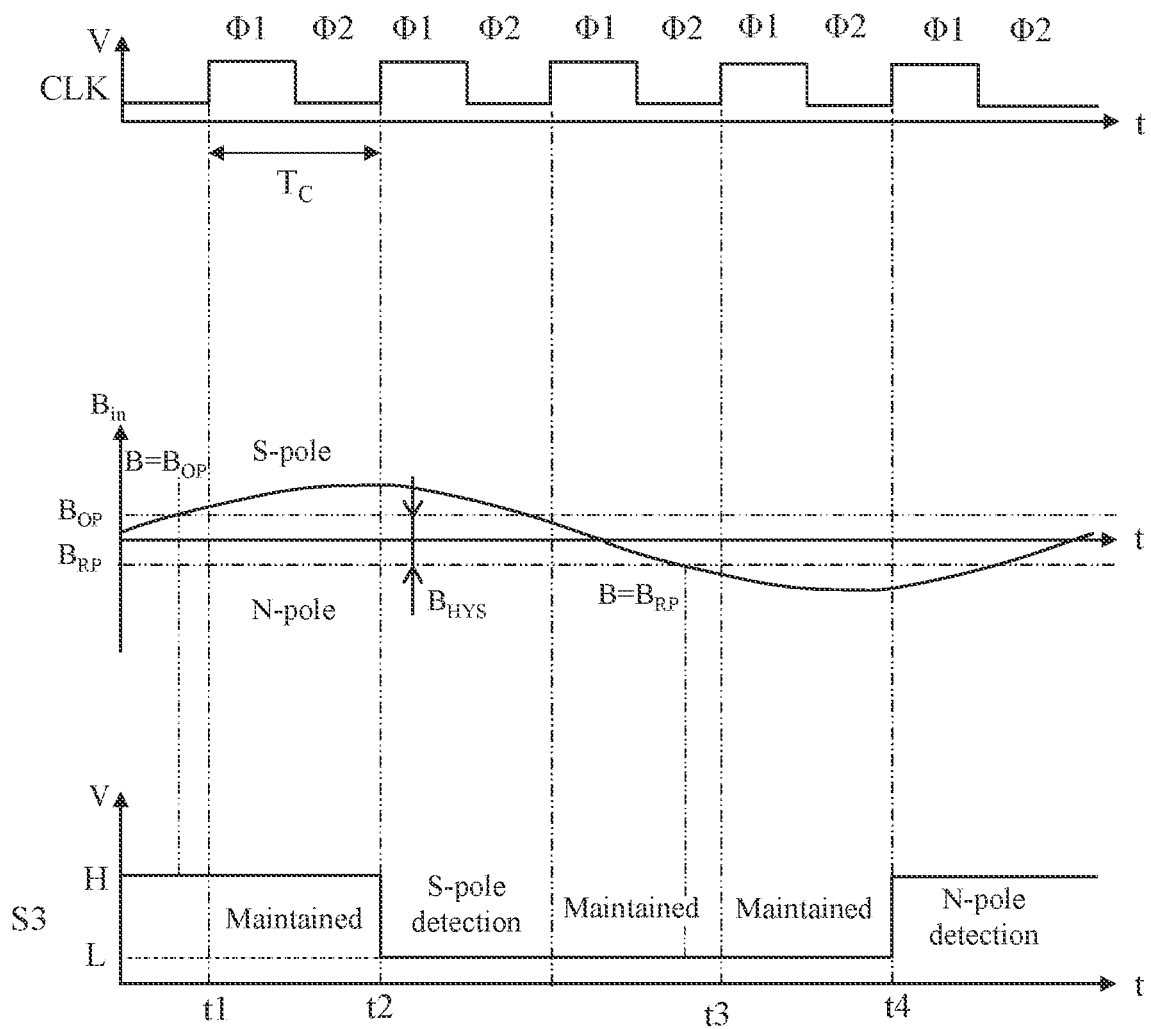
FIG. 13 is a schematic graph for showing a relationship among a reference clock signal supplied to the control circuit, the magnetic flux density Bin, and a magnetic detection state.

FIG. 13 is a schematic graph for showing a relationship among the reference clock signal CLK, the magnetic flux density Bin, and the magnetic detection state. In the description, it is assumed that the latch circuit 80A is reset at a time t=0. It is also assumed that initial values being values of the magnetic flux density Bin and the signal S3 at the time t=0 are the magnetic flux density Bin=0 and the signal S3=(H level), respectively.

The reference clock signal CLK is a periodic signal set at the H level in the first period Φ1 and at the L level in the second period Φ2. The latch circuit 80A updates the determination result of the magnetic flux density Bin based on the magnetoelectric conversion characteristic having the signal S3 subjected to offset cancellation at the last timing in the second period Φ2.

In a case of the magnetic flux density Bin exceeding the operating point $B_{OP}$ to the positive side (from bottom to top of FIG. 13) with a lapse of time from the time t=0 to transition to a state of the S-pole detection, a determination operation for the S-pole detection is started from the time t1 of the first arrival of the first period Φ1. At the time t1, the N-pole detection being the immediately preceding detection state is held. Then, a time t2 is reached after a lapse of the period TC while the state of the magnetic flux density Bin exceeding the operating point $B_{OP}$, that is, the state of the S-pole detection is maintained. At the time t2, the latch circuit 80A sends the signal S3 at the L level indicating the S-pole detection. That is, at the time t2, the determination result of the magnetic flux density Bin is updated from the N-pole detection to the S-pole detection.

In a case of the magnetic flux density Bin having changed from the S-pole to the N-pole after a further lapse of time to transition to a state of exceeding the returning point $B_{RP}$ to the negative side (from top to bottom of FIG. 13), a determination operation for the N-pole detection is started from a time t3 of the first arrival of the first period Φ1. At the time t3, the S-pole detection being the immediately preceding detection state is held. Then, a time t4 is reached after the lapse of the period Tc while the state of the N-pole detection of the magnetic flux density Bin is maintained. At the time t4, the latch circuit 80A sends the signal S3 at the level indicating the N-pole detection. That is, at the time t4, the determination result of the magnetic flux density Bin is updated from the S-pole detection to the N-pole detection. In a case of the magnetic flux density Bin fluctuating periodically, the above-described operation is repeated.

In this manner, the signal S3 transitioning between the L level and the H level is sent from the latch circuit 80A to the output terminal 12, the control circuit 50, and the SH comparator 40A. The reference clock signal CLK is supplied to the control circuit 50 together with the signal S3. In the control circuit 50, the drive control signals Sd1 to Sd4 and the transmission control signals St1 and St2 are generated based on the supplied signals S3 and the supplied reference clock signal CLK.

Figure 14:
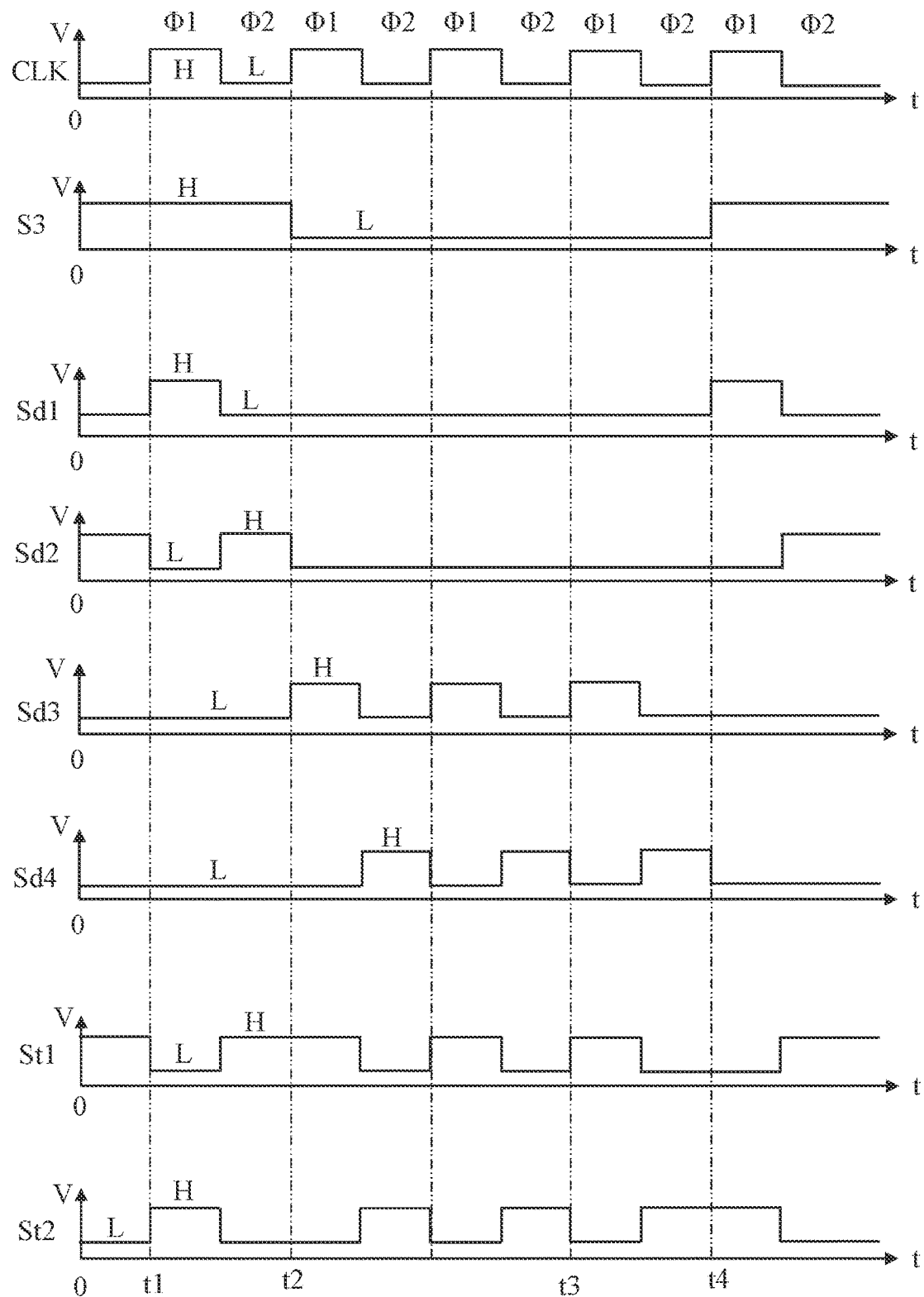
FIG. 14 is a timing chart of the reference clock signal supplied to the control circuit, a latch output signal, and drive control signals and transmission control signals sent from the control circuit.

FIG. 14 is a timing chart of the reference clock signal CLK and the signal S3 supplied to the control circuit 50; and the drive control signals Sd1 to Sd4 and the transmission control signals St1 and St2 sent from the control circuit 50. The timing chart shown in FIG. 14 indicates a case of applying the above-described first control logic pattern. In addition, in the same manner as in FIG. 13, it is assumed that the latch circuit 80A is reset at the time t=0, and that the initial values being values of the magnetic flux density Bin and the signal S3 at the time t=0 are the magnetic flux density Bin=0 and the signal S3=(H level), respectively.

The control circuit 50 is switched, based on the signal S3, between a first mode in accordance with the table at the time of the N-pole detection shown in FIG. 4 and a second mode in accordance with the table at the time of the S-pole detection shown in FIG. 4. In the timing chart shown in FIG. 14, the N-pole detection is effected at the time t satisfying 0<t<t2 and t≥t4, and the S-pole detection is effected at the time t satisfying t2≤t<t4.

In the N-pole detection, the drive control signals Sd1 and Sd2 and the transmission control signals St2 and St1 operate in synchronization with the reference clock signal CLK. The drive control signal Sd1 and the drive control signal Sd2 are sent under a state of being different in level from each other between the L level and the H level, that is, sent in opposite phases. The transmission control signal St2 and the transmission control signal St1 are also sent in opposite phases in the same manner as the drive control signal Sd1 and the drive control signal Sd2, respectively.

Thus, in the N-pole detection at the time t satisfying 0<t<t2 and t≥t4, the drive control signal Sd1 and the transmission control signal St2 are set at the H level in the first period Φ1 and set at the L level in the second period Φ2, The drive control signal Sd2 and the transmission control signal St1 are set at the L level in the first period Φ1 and set at the H level in the second period Φ2.

Meanwhile, in the S-pole detection, the drive control signals Sd3 and Sd4 and the transmission control signals St1 and St2 operate in synchronization with the reference clock signal CLK. The drive control signal Sd3 and the drive control signal Sd4 are sent in opposite phases. The transmission control signal St1 and the transmission control signal St2 are sent in opposite phases.

Thus, in the S-pole detection at the time t satisfying t2<t<t4, the drive control signal Sd3 and the transmission control signal St1 are set at the H level in the first period Φ1 and set at the L level in the second period Φ2. The drive control signal Sd4 and the transmission control signal St2 are set at the L level in the first period Φ1 and set at the H level in the second period Φ2.

In this manner, the magnetic switch 10A includes the SH comparator 40A configured to be able to supply the predetermined reference voltage while switching the predetermined reference voltage from among a plurality of candidates. According to the magnetic switch 10A and the semiconductor device 1A including the magnetic switch 10A, the direction of the drive current is switched based on the level of the signal S3, to thereby be able to obtain the returning point $B_{RP}$ on the N-pole side by inverting the operating point $B_{OP}$ on the S-pole side with respect to the straight line of Bin=0 or the operating point $B_{OP}$ on the S-pole side by inverting the returning point $B_{RP}$ on the N-pole side with respect to the straight line of Bin=0. Whether to obtain the returning point $B_{RP}$ on the N-pole side by inverting the operating point $B_{OP}$ on the S-pole side with respect to the straight line of Bin=0 or to obtain the operating point $B_{OP}$ on the S-pole side by inverting the returning point Bap on the N-pole side with respect to the straight line of Bin=0 can be changed by switching the open/closed states of the switches SL1a, SL1b, and SL1c and the switches SL2a, SL2b, and SL2c.

According to the first embodiment, a hysteresis characteristic having a high symmetric property can be obtained because an influence of a residual offset voltage can be exerted line-symmetrically on the S-pole side and the N-pole side through use of the two-way drive spinning current method involving switching the direction of the drive current based on the level of the signal S3, Thus, according to the first embodiment, it is possible to obtain a magnetoelectric conversion switching characteristic having the same absolute value of the operating point $B_{OP}$ and the returning point $B_{RP}$, that is, a magnetoelectric conversion switching characteristic being line-symmetric at the S-pole and the N-pole.

As described above, the magnetoelectric conversion switching characteristic of the entire magnetic switch 10A is the magnetoelectric conversion switching characteristic being line-symmetric at the S-pole and the N-pole. Thus, according to the first embodiment, a magnetoelectric conversion switching characteristic capable of suppressing the influence of the residual offset voltage to the same extent as in a case of using a four-way drive spinning current method can be obtained through use of the two-way drive spinning current method involving switching the direction of the drive current based on the level of the signal S3.

In addition, because the two-way drive spinning current method is used irrespective of the same processing time for each direction, a processing time required for detecting and determining the magnetic pole can be halved as compared with the four-way drive spinning current method. Accordingly, irrespective of the same processing time for each direction, the magnetic switch 10A and the semiconductor device 1A including the magnetic switch 10A can process signals in a shorter period of time than in a case of a magnetic switch using the four-way drive spinning current method and the semiconductor device including this magnetic switch.

In the magnetic switch using the four-way drive spinning current method and the semiconductor device including this magnetic switch, it may be possible to achieve the same processing time per cycle period by increasing a reference clock frequency. However, the increasing of the reference clock frequency necessitates an increase in bandwidth of an amplifier or a comparator, and adversely increases power consumption. Accordingly, irrespective of the same processing time for all the drive directions (per cycle period), the magnetic switch 10A and the semiconductor device 1A including the magnetic switch 10A can process signals with lower power consumption than in the case of the magnetic switch using the four-way drive spinning current method and the semiconductor device including this magnetic switch.

According to the first embodiment, two different patterns of the line-symmetric magnetoelectric conversion switching characteristic can be obtained depending on whether to assign, based on the level of the signal S3, the direction of the drive current so that the magnetic offset $B_{OSDP}$ of the horizontal Hall element 20 itself becomes positive or negative. In the case of the magnetic offset $B_{OSDP}$ of the horizontal Hall element 20 itself being positive, apparent sensitivity deviation can be set to deviation toward the low sensitivity side. In the case of the magnetic offset $B_{OSDP}$ of the horizontal Hall element 20 itself being negative, the apparent sensitivity deviation can be set to deviation toward the high sensitivity side. According to the first embodiment, it is also possible to switch and select a desired one pattern of the line-symmetric magnetoelectric conversion switching characteristic from the two different patterns of the line-symmetric magnetoelectric conversion switching characteristic.

According to the first embodiment, the operating point $B_{OP}$ and the returning point $B_{RP}$ can be optimized by adjustment work in advance. For example, in a case of systematic variations of the magnetic offset $B_{OSDP}$ for each combination of directions of the drive current with a known polarity of the magnetic offset $B_{OSDP}$, the reference voltage $V_{BRP}$ and the absolute value of $V_{BRP}$ may be adjusted in advance in previous consideration of the deviation amount of the magnetic offset $B_{OSDP}$.

Meanwhile, in a case of large random variations of the magnetic offset $B_{OSDP}$ for each combination of directions of the drive current with an unknown polarity, the magnetic offset $B_{OS}$ in the magnetoelectric conversion switching characteristic of the magnetic switch 10A included in the semiconductor device 1A is first measured. Then, an adjustment step of, for example, fuse trimming or EEPROM writing in consideration of a result of the measurement of the magnetic offset $B_{OS}$ in the magnetoelectric conversion switching characteristic may be added.

According to the first embodiment, the influence of the residual offset voltage can be exerted line-symmetrically on the S-pole side and the N-pole side irrespective of a magnitude of the magnetic offset $B_{OSDP}$ of the horizontal Hall element 20 itself. Thus, in order to suppress the magnetic offset $B_{OSDP}$ of the horizontal Hall element 20 itself, the magnetic switch 10A may not include the horizontal Hall element 20 having a plurality of Hall element cells connected in parallel, According to the first embodiment, it is possible to obtain the magnetoelectric conversion switching characteristic being line-symmetric at the S-pole and the N-pole without increasing a chip occupied area and current consumption.

Second Embodiment

Figure 15:
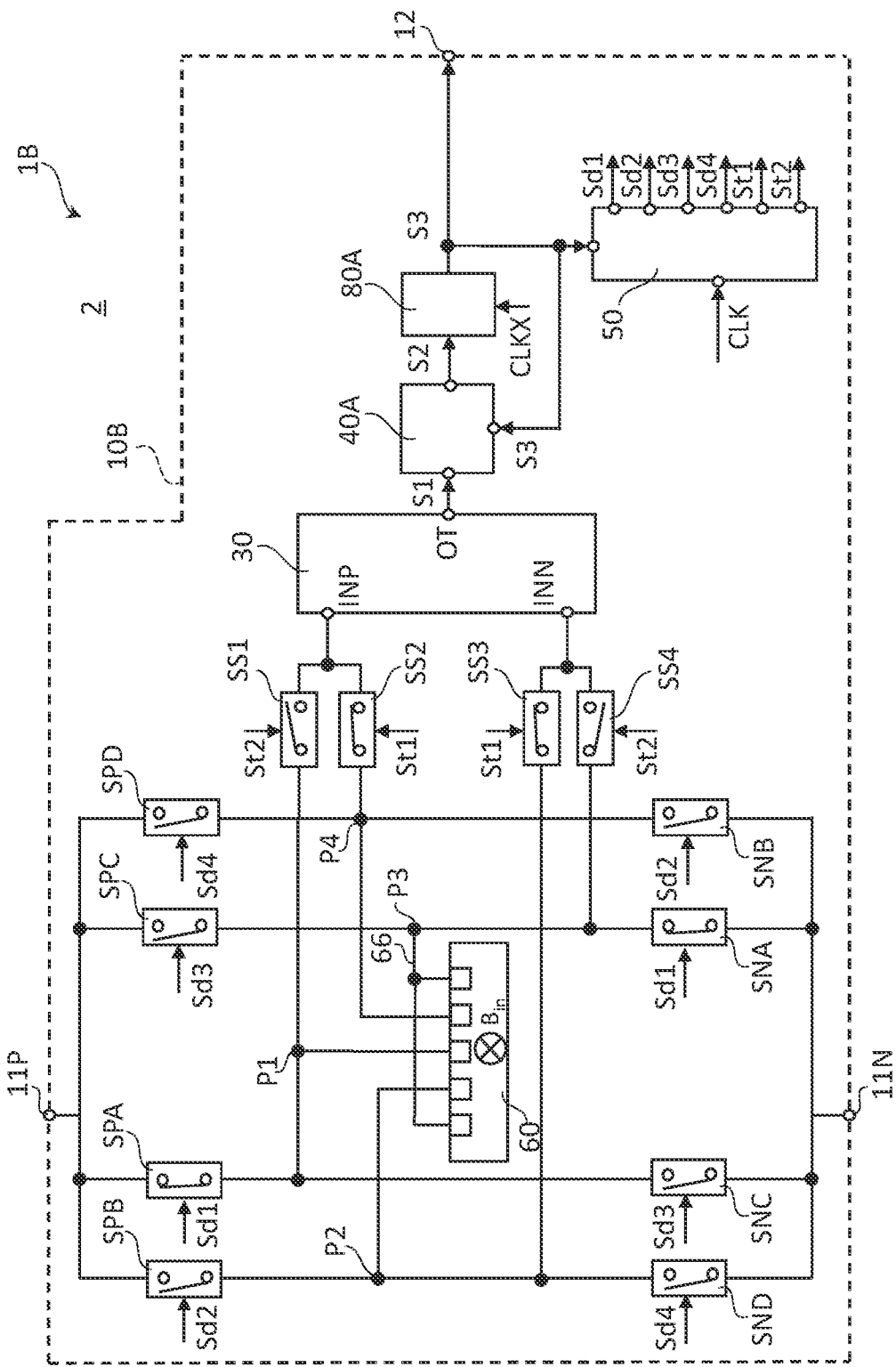
FIG. 15 is a schematic diagram of a semiconductor device according to a second embodiment of the present invention.

FIG. 15 is a schematic diagram for illustrating a configuration of a semiconductor device 1B according to a second embodiment of the present invention.

FIGS. 16A through 16D are explanatory diagrams for illustrating a configuration and a connection state of a vertical Hall element 60 included in the semiconductor device 1B.

The semiconductor device 1B is the same as the semiconductor device 1A except that the semiconductor device 1B includes the vertical Hall element 60 instead of the horizontal Hall element 20 connected to the node P1 to the node P4, but the other points are the same. In view of this, in the second embodiment, the vertical Hall element 60 is mainly described, and description overlapping with that of the semiconductor device 1A is omitted.

The semiconductor device 1B includes a magnetic switch 10B provided to the semiconductor substrate 2. The magnetic switch 10B includes the drive terminals 11P and 11N, the output terminal 12, the vertical Hall element 60, the switches SP1 to SP4 and SN1 to SN4, the switches 551 to SS4, the amplifier 30, the SH comparator 40A, the control circuit 50, and the latch circuit 80A.

The vertical Hall element 60 includes electrodes 61 to 65. For example, the electrode 61 to the electrode 65 are arranged at predetermined distances along a Y-axis direction. The two electrodes 61 and 65 located at the outermost ends in a direction along the Y-axis direction are connected (short-circuited) to each other by a wiring 66. The electrodes 61 and 65 are connected to the node P3 through the wiring 66. The electrode 62 is connected to the node P2. The electrode 63 is connected to the node P1 The electrode 64 is connected to the node P4.

Figure 16A:
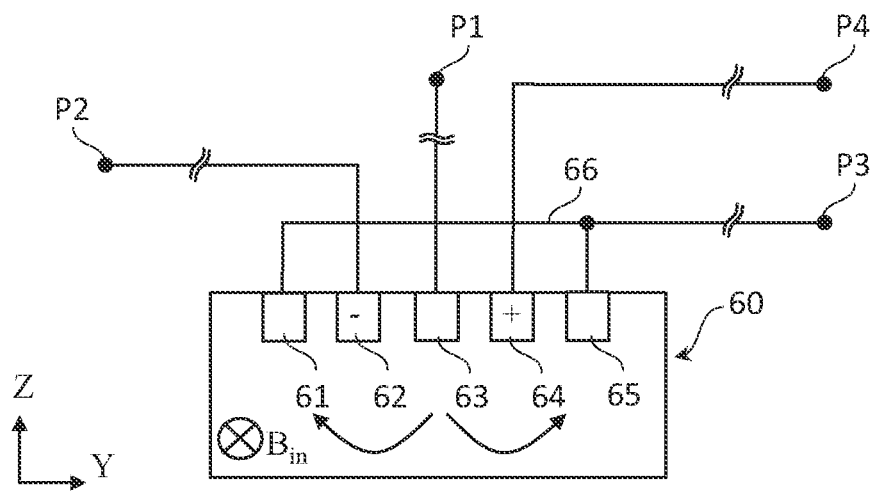
FIGS. 16A, 16B, 16C, and 16D are explanatory diagrams for illustrating directions of a drive current of a vertical Hall element of the semiconductor device according to the second embodiment.
Figure 16B:
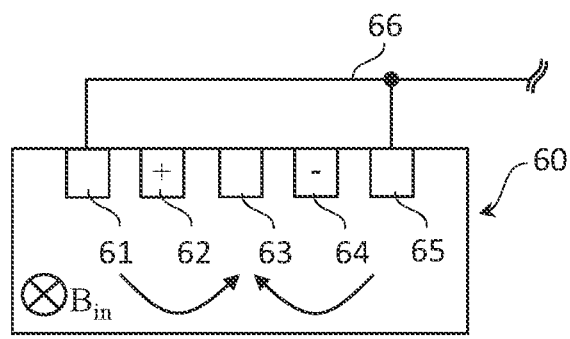
Figure 16C:
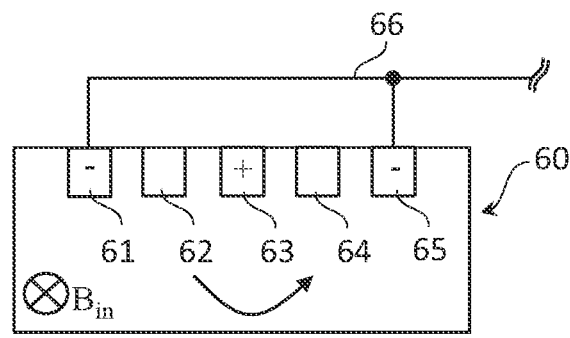
Figure 16D:
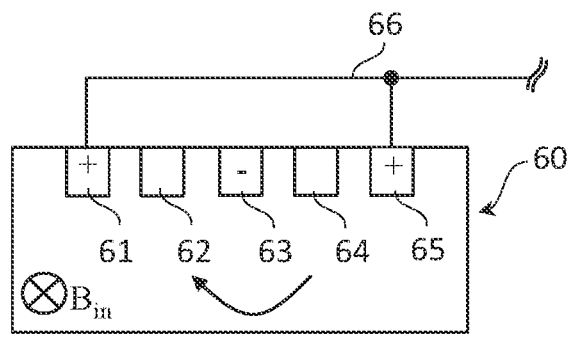

In the magnetic switch 10B configured as described above, a first current drive direction to a fourth current drive direction can be defined in the same manner as in the case of the magnetic switch 10A. For example, a direction of the drive current flowing from the third electrode 63 located at the center of the electrodes 61 to 65 to each of the first electrode 61 and the fifth electrode 65 at the outermost ends is defined as the first current drive direction as illustrated in FIG. 16A. A direction of the drive current flowing from each of the electrode 61 and the electrode 65 to the electrode 63, that is, a direction opposite to the first current drive direction is defined as the second current drive direction as illustrated in FIG. 16B, A direction of the drive current flowing from the electrode 62 located at the second position of the electrodes 61 to 65 to the electrode 64 located at the fourth position is defined as the third current drive direction as illustrated in FIG. 16C. A direction of the drive current flowing from the electrode 64 to the electrode 62, that is, a direction opposite to the third current drive direction is defined as the fourth current drive direction as illustrated in FIG. 16D.

According to the above-described example, the vertical Hall element 60 generates a positive Hall electromotive force between the electrode 64 and the electrode 62 in the first current drive direction, and generates a positive Hall electromotive force between the electrode 63 and each of the electrodes 61 and 65 in the third current drive direction. Meanwhile, the vertical Hall element 60 generates a negative Hall electromotive force between the electrode 64 and the electrode 62 in the second current drive direction, and generates a negative Hall electromotive force between the electrode 63 and each of the electrodes 61 and 65 in the fourth current drive direction.

The semiconductor device 1B and the magnetic switch 10B configured in this manner can be operated in the same manner as the semiconductor device 1A and the magnetic switch 10A. The semiconductor device 1B and the magnetic switch 10B perform the same operations as those of the semiconductor device 1A and the magnetic switch 10A, to thereby produce the same effects as those of the semiconductor device 1A and the magnetic switch 10A.

In this manner, according to the second embodiment, the line-symmetric magnetoelectric conversion switching characteristic can be obtained through use of the two-way drive spinning current method involving switching the direction of the drive current based on the level of the signal S3. That is, it is possible to obtain the same effects as those of the first embodiment, for example, the magnetoelectric conversion switching characteristic capable of suppressing the influence of the residual offset voltage to the same extent as in the case of using the four-way drive spinning current method.

In addition, the vertical Hall element 60 tends to have its own magnetic offset $B_{OSDP}$ larger than the horizontal Hall element 20 due to its asymmetric geometric structure. Accordingly, it can be said that the advantage of being able to obtain a line-symmetric magnetoelectric conversion characteristic in the second embodiment is more remarkable than the advantage of being able to obtain a line-symmetric magnetoelectric conversion characteristic in the first embodiment.

The vertical Hall element 60 shown in FIGS. 16A through 16D is an example of arranging the electrodes 61 to 65 in the direction along the Y-axis with the direction of the magnetic flux density Bin being parallel to an X-axis. However, the vertical Hall element 60 is not limited to this example. It suffices that the vertical Hall element 60 has such a relationship that the direction of arranging the electrodes 61 to 65 is perpendicular to the direction of the magnetic flux density Bin. For example, in the vertical Hall element 60, the electrodes 61 to 65 may be arranged in a direction along the X-axis, and the direction of the magnetic flux density Bin may be a direction parallel to the Y-axis.

Third Embodiment

Figure 17:
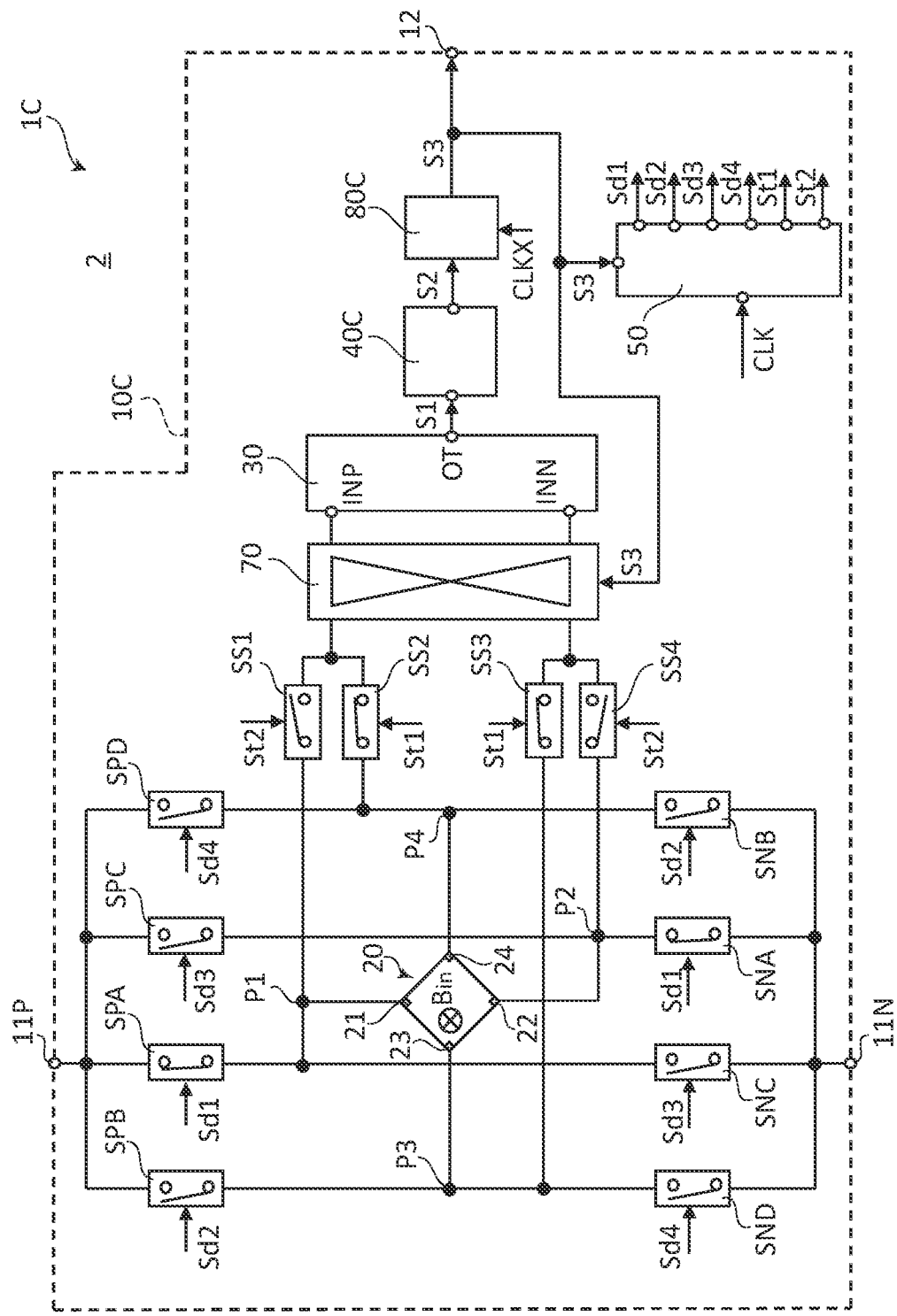
FIG. 17 is a schematic diagram of a semiconductor device according to a third embodiment of the present invention.

FIG. 17 is a schematic diagram for illustrating a configuration of a semiconductor device 1C according to a third embodiment of the present invention.

The semiconductor device 1C is the same as the semiconductor device 1A except that the semiconductor device 1C further includes a chopper switch 70 configured to switch connection between an input terminal and an output destination based on the signal S3 and includes an SH comparator 40C and a latch circuit 80C instead of the SH comparator 40A and the latch circuit 80A, respectively. In view of this, in the third embodiment, the above-described differences are mainly described, and description overlapping with that of the semiconductor device 1A is omitted.

The semiconductor device 1C includes a magnetic switch 10C provided to the semiconductor substrate 2. The magnetic switch 10C includes the drive terminals 11P and 11N, the output terminal 12, the vertical Hall element 20, the switches SP1 to SP4 and SN1 to SN4, the switches SS1 to SS4, the chopper switch 70, the amplifier 30, the SH comparator 40C, the control circuit 50, and the latch circuit 80C.

The chopper switch 70 is arranged in a stage before the SH comparator 40C serving as the comparison circuit. In the semiconductor device 1C illustrated in FIG. 17, the chopper switch 70 is connected between the second terminals of the switches SS1 to SS4; and the positive phase input terminal INP and the negative phase input terminal INN of the amplifier 30.

The chopper switch 70 includes a differential input unit, a differential output unit, a switching unit capable of switching a path for connecting the differential input unit and the differential output unit in two ways, and a control terminal to be supplied with the signal S3 being a control signal for switching the path.

In the chopper switch 70, the differential input unit contains a first input terminal and a second input terminal. The first input terminal and the second input terminal are connected to the second terminals of the switches SS1 and SS2 and the second terminals of the switches SS3 and SS4, respectively. The differential output unit contains a first output terminal and a second output terminal. The first output terminal and the second output terminal are connected to the positive phase input terminal INP and the negative phase input terminal INN, respectively.

The switching unit of the chopper switch 70 includes four paths for individually opening and closing connection between each of the first input terminal and the second input terminal and each of the first output terminal and the second output terminal. The above-described four paths are formed of a first path for connecting the first input terminal and the first output terminal in an openable and closable manner, a second path for connecting the first input terminal and the second output terminal in an openable and closable manner, a third path for connecting the second input terminal and the first output terminal in an openable and closable manner, and a fourth path for connecting the second input terminal and the second output terminal in an openable and closable manner. The open/closed states of the above-described four paths can be switched based on a control signal supplied from the control terminal.

The chopper switch 70 is configured to switch connection between a first connection state of the first path and the fourth path being closed and the second path and the third path being open and a second connection state of the first path and the fourth path being open and the second path and the third path being closed. In this case, the first connection state is a straight connection state, and the second connection state is a cross connection state.

In the chopper switch 70, under the first connection state, namely, the straight connection state, the signals supplied from the first input terminal and the second input terminal can be sent from the first output terminal and the second output terminal while having the same polarity. Meanwhile, under the second connection state, namely, the cross connection state, the signals supplied from the first input terminal and the second input terminal can be sent from the first output terminal and the second output terminal while inverting the polarities of the supplied signals (causing the supplied signals to have the opposite polarities).

Figure 18:
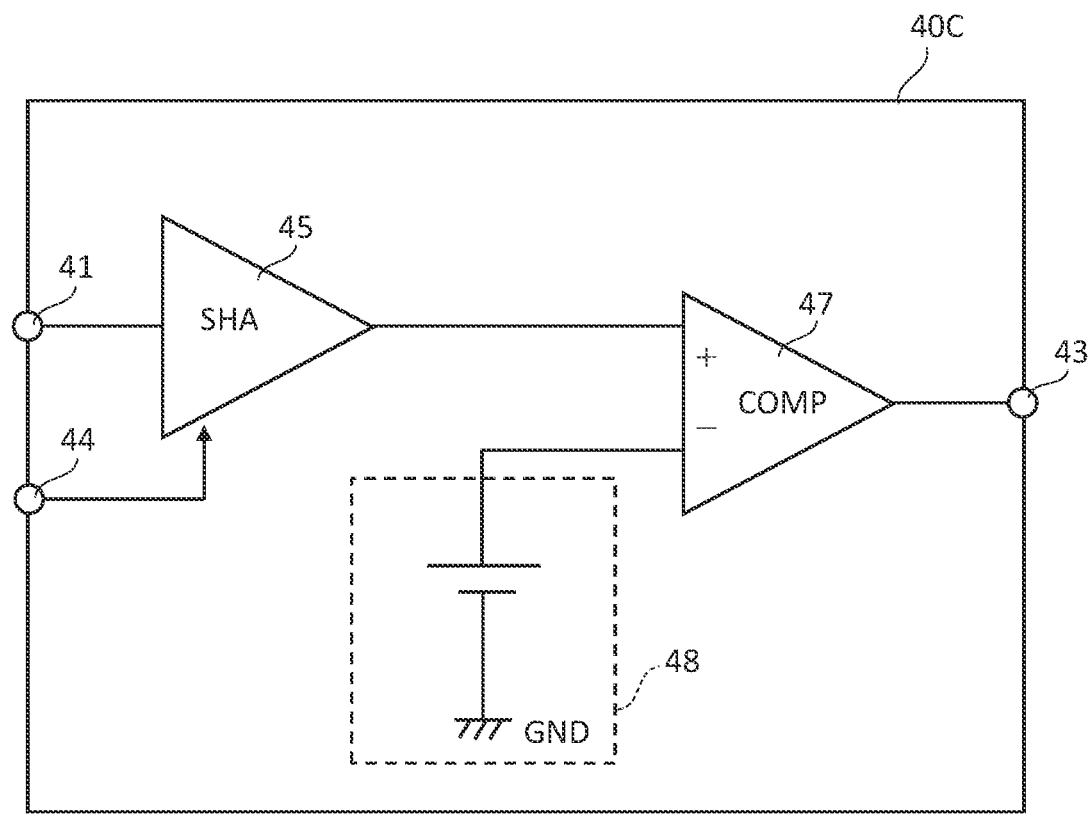
FIG. 18 is a circuit diagram for illustrating an example of a sample-and-hold comparator in the semiconductor device according to the third embodiment.

FIG. 18 is a circuit diagram for illustrating an example of the SH comparator 40C.

The SH comparator 40C is substantially the same as the SH comparator 40A except that the SH comparator 40C includes a reference voltage circuit 48 instead of the reference voltage circuit 46.

The reference voltage circuit 48 is configured to be able to apply a predetermined reference voltage (constant voltage). That is, in the SH comparator 40C obtained by omitting a function of varying the reference voltage from the SH comparator 40A, reference voltages for setting the operating point $B_{OP}$ and the returning point $B_{RP}$ of the horizontal Hall element 20 are unified (integrated into one). This is because the chopper switch 70 can send the differentially supplied signals while inverting the polarities of the differentially supplied signals, to thereby be able to unify the polarities of the signals supplied to stages subsequent to the amplifier 30 into any one of positive and negative polarities. In the description of the third embodiment, the predetermined reference voltage is set to the reference voltage Viol being a voltage having a positive polarity.

The latch circuit 80C is substantially the same as the latch circuit 80A except that the latch circuit 80C has a different logic for determining the signal S3 to be sent based on the supplied signal S2, that is, includes a different latch output signal generator (not shown). The latch circuit 80C is configured to be able to send a signal having the same level as that of the signal S2 or a signal having a level opposite to that of the signal S2 as the signal S3 based on the supplied signal S2 and the supplied negative phase reference clock signal CLKX. That is, the latch circuit 80C is a so-called toggle-type latch circuit configured to be toggleable.

Next, an action of the magnetic switch 10C is described.

In the magnetic switch 10C, in the same manner as in the magnetic switch 10A, the output signal of the horizontal Hall element 20 passes through the switches SS1 to SS4 to be supplied to the chopper switch 70 from a first input terminal and a second input terminal being the differential input unit. In addition, the signal S3 sent from the latch circuit 80A is supplied from the control terminal to the chopper switch 70.

The chopper switch 70 transitions, based on the level of the signal S3, to any one of a first connection state for sending the differentially supplied signals as they are without inverting the polarities of the differentially supplied signals and a second connection state for sending the differentially supplied signals while inverting the polarities of the differentially supplied signals. Thus, the chopper switch 70 sends the differentially supplied signals as they are or sends the differentially supplied signals while inverting the polarities of the differentially supplied signals depending on the level of the signal S3. The polarities of the signals differentially supplied to the chopper switch 70 are switched based on the level of the signal S3. Accordingly, it is possible to obtain a magnetoelectric conversion switching characteristic being line-symmetric with respect to such a straight line of Bin=0 as described later with reference to FIG. 19 and FIG. 20.

The signals sent from the first output terminal and the second output terminal of the chopper switch 70 are supplied to the positive phase input terminal INP and the negative phase input terminal INN. The operation is performed in the amplifier 30 as described above.

In the SH comparator 40C subsequent to the amplifier 30, in the same manner as in the SH comparator 40A, comparison determination is performed by comparing the difference voltage signal serving as the difference signal between the sampled signal S1 in the first period $\Phi 1$ and the signal S1 in the second period $\Phi 2$ with the predetermined reference voltage. The SH comparator 40C sends the signal S2 having a level corresponding to a result of the comparison determination between the difference voltage signal and the predetermined reference voltage. The predetermined reference voltage is a constant voltage applied from the reference voltage circuit 48 irrespective of the level of the signal S3. The signal S2 is supplied from the SH comparator 40C to the latch circuit 80C.

The latch circuit 80C performs a toggle operation at the last timing in the second period $\Phi 2$, that is, at the falling edge of the negative phase reference clock signal CLKX. To describe this toggle operation more specifically, in a case of the level of the signal S2 being the H level, the signal S3 having a level switched to the opposite level from the currently held level of the signal S3 is sent. In a case of the level of the signal S2 being the L level, the signal S3 holding the currently held level of the signal S3 is sent. The signal S3 sent from the latch circuit 80C is transmitted to the output terminal 12, the control circuit 50, and the chopper switch 70. The operation is performed in the control circuit 50 as described above.

Next, the magnetoelectric conversion switching characteristic of the magnetic switch 10C is described.

The magnetic switch 10C not only switches the combination of directions of the drive current in the same manner as the magnetic switch 10A, but also further switches, based on the signal S3, whether to send the magnetoelectric conversion characteristic subjected to the offset cancellation at the time of selecting the first direction pair while inverting the polarities of the signals supplied to the chopper switch 70 or without inverting the polarities.

Figure 19:
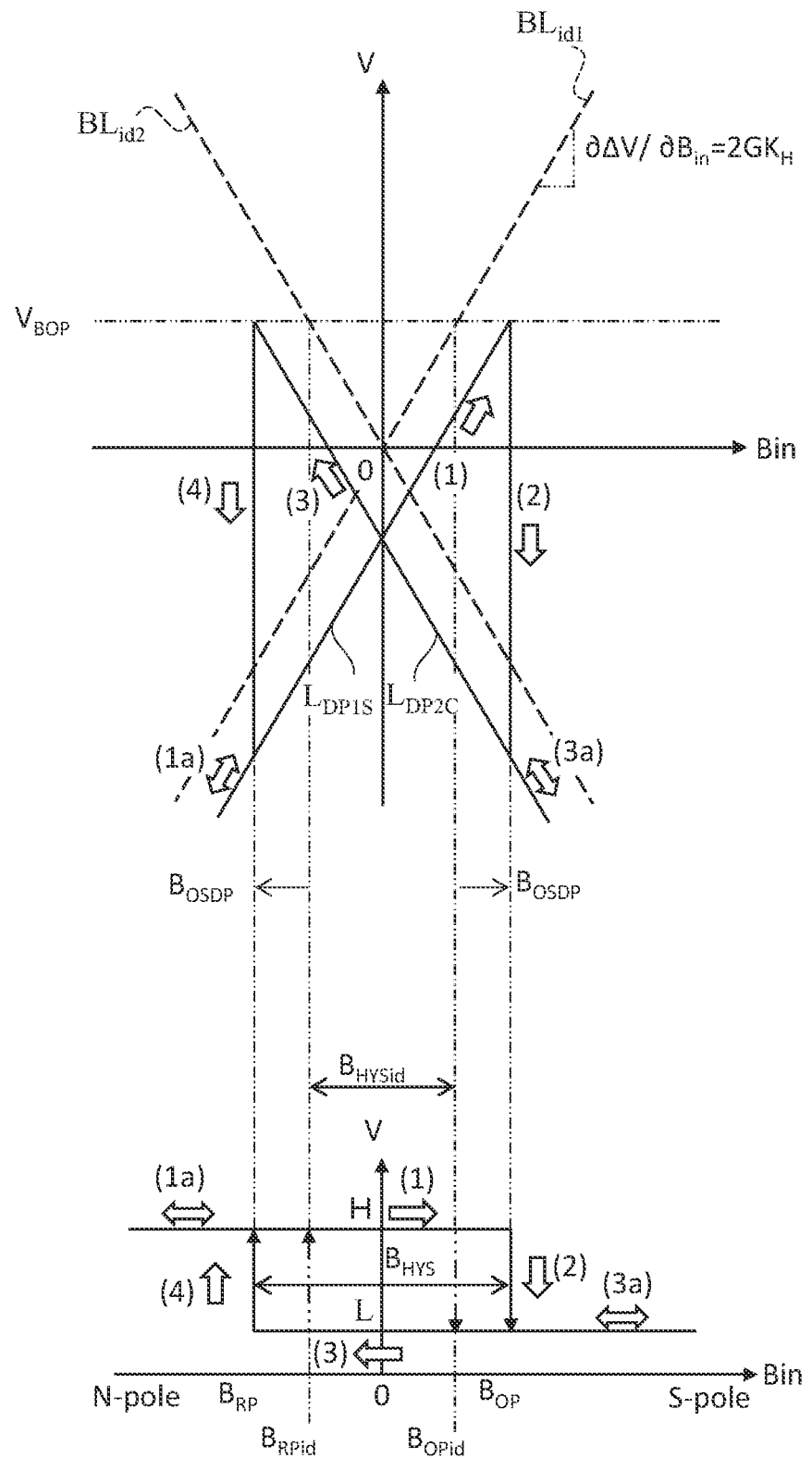
FIG. 19 is a schematic graph for showing a relationship of an output voltage of an amplifier and an output voltage of a latch circuit with respect to the magnetic flux density Bin in a case of a positive magnetic offset of a horizontal Hall element itself of the semiconductor device according to the third embodiment.

FIG. 19 is a schematic graph for showing a relationship between the signal S1 and the signal S3 with respect to the magnetic flux density Bin in a case of a magnetic offset of the horizontal Hall element 20 itself of the semiconductor device 1C being positive.

In FIG. 19, a solid line $L_{DP1S}$ indicates such a magnetoelectric conversion characteristic that the magnetic offset $B_{OSDP}$ becomes positive in the case of the direction pair of the drive current being the first direction pair. A solid line $L_{DP2C}$ indicates such a magnetoelectric conversion characteristic that the magnetic offset $B_{OSDP}$ becomes negative in the case of the direction pair of the drive current being the second direction pair. A broken line $BL_{id1}$ indicates a magnetoelectric conversion characteristic obtained by taking a difference between magnetoelectric conversion characteristics in both directions in the case of the drive current flowing in the first direction pair. A broken line $BL_{id2}$ indicates a magnetoelectric conversion characteristic obtained by taking a difference between magnetoelectric conversion characteristics in both directions in the case of the drive current flowing in the second direction pair. The hollow arrows (1), (1a), (2), (3), (3a), and (4) each represent a hysteresis locus of the magnetoelectric conversion characteristic.

In addition, the magnetoelectric conversion characteristic shown in FIG. 19 is an example in a case of the third direction being selected in the first period Φ1 with the signal S3 at the H level, the first direction being selected in the second period Φ2 with the signal S3 at the H level, the fourth direction being selected in the first period Φ1 with the signal S3 at the L level, and the second direction being selected in the second period Φ2 with the signal S3 at the L level. In this example, during a period of the signal S3 at the H level, the chopper switch 70 is in the straight connection state as the first connection state, During a period of the signal S3 at the L level, the chopper switch 70 is in the cross connection state as the second connection state.

Figure 20:
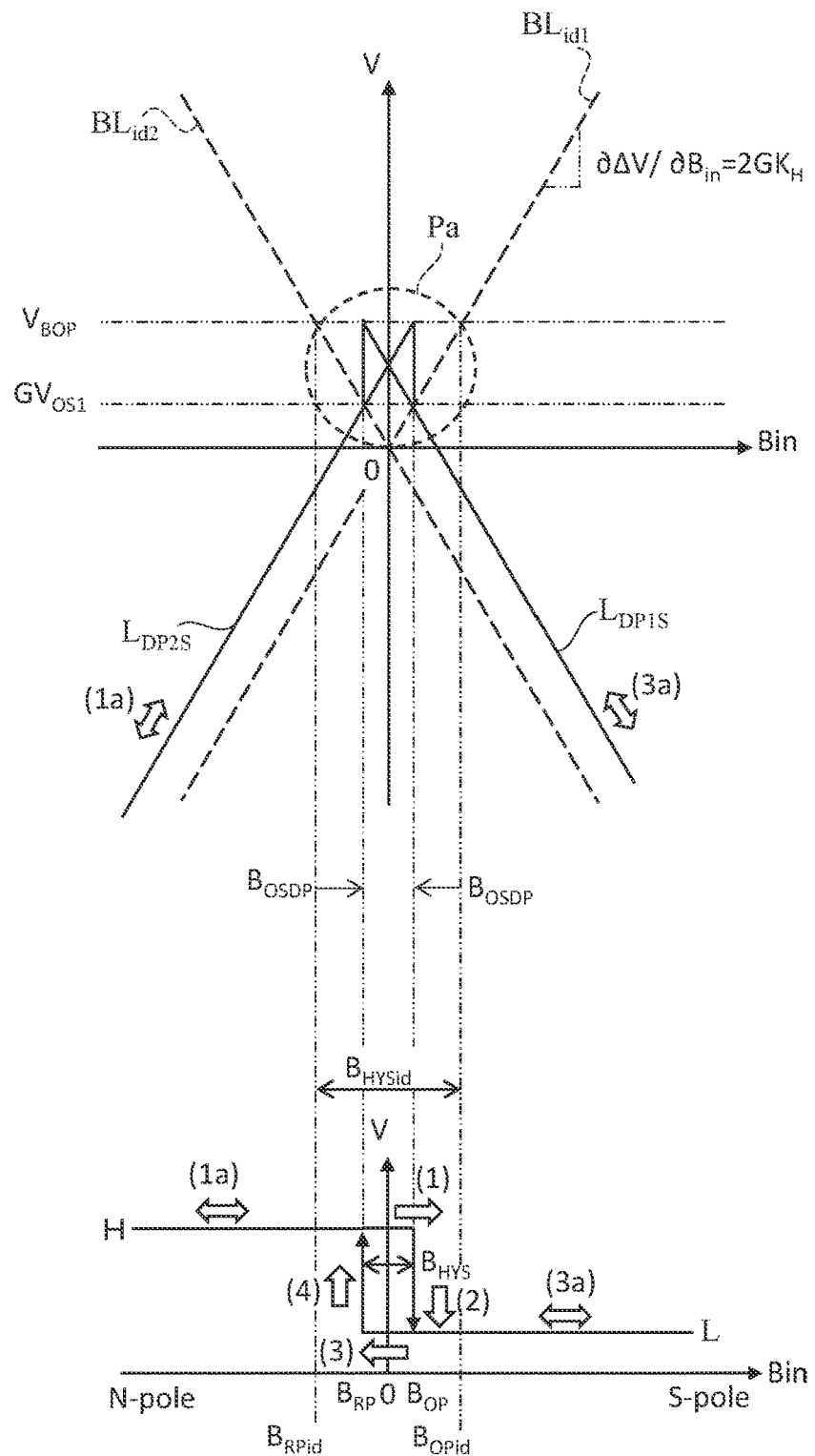
FIG. 20 is a schematic graph for showing a relationship of the output voltage of the amplifier and the output voltage of the latch circuit with respect to the magnetic flux density Bin in a case of a negative magnetic offset of the horizontal Hall element itself of the semiconductor device according to the third embodiment.

The magnetic switch 10C includes the chopper switch 70, to thereby be able to send the signals supplied to the chopper switch 70 while inverting the polarities of the supplied signals. Thus, the solid line Lapis and a solid line $L_{DP1C}$ described later with reference to FIG. 20 are line segments symmetrical with respect to the magnetic flux density Bin being the horizontal axis. Meanwhile, the solid line $L_{DP2C}$ and the solid line $L_{DP2S}$ described later with reference to FIG. 20 are line segments symmetrical with respect to the magnetic flux density Bin being the horizontal axis.

The hollow arrow (1) represents a locus on a magnetoelectric conversion characteristic corresponding to the solid line $L_{DP1S}$ in the case of the magnetic flux density Bin increasing toward the S-pole side with the signal S3 at the H level. The signal S3 transitions to the L level at a timing of the voltage supplied to the SH comparator 40C, namely, the voltage of the signal S1 exceeding the reference voltage $V_{BOP}$ (ΔV·G>$V_{BOP}$).

At the time of the signal S3 transitioning to the L level, the selected direction of the drive current is switched to the second direction pair, and the chopper switch 70 is further switched from the straight connection state to the cross connection state. In accordance with the level transition of the signal S3, the locus on the magnetoelectric conversion characteristic corresponding to the solid line $L_{DP1S}$ transitions to a locus on a magnetoelectric conversion characteristic corresponding to the solid line $L_{DP2C}$ (hollow arrow (2)). After that, in the case of the magnetic flux density Bin further increasing toward the S-pole side, the voltage V further increases to the negative side along the solid line $L_{DP2C}$ (hollow arrow (3a)).

Meanwhile, the locus at times of the magnetic flux density Bin decreasing in S-pole, becoming Bin=0, and further turning to an increase in N-pole is indicated by the hollow arrow (3). After a further increase of the magnetic flux density Bin toward the N-pole side, at the timing of the voltage of the signal S1 exceeding the reference voltage $V_{BOP}$ (ΔV·G>$V_{BOP}$), the signal S3 transitions to the H level.

Through the transition of the signal S3 to the H level, the selected direction of the drive current is switched to the first direction pair, and the chopper switch 70 is further switched from the cross connection state to the straight connection state. In accordance with the level transition of the signal S3, the locus on the magnetoelectric conversion characteristic corresponding to the solid line $L_{DP2C}$, transitions to the locus on the magnetoelectric conversion characteristic corresponding to the solid line $L_{DP1S}$ (hollow arrow (4)). After that, in the case of the magnetic flux density Bin further increasing toward the N-pole side, the voltage V further increases to the negative side along the solid line $L_{DP1S}$ (hollow arrow (1a)). Meanwhile, the locus at times of the magnetic flux density Bin decreasing in N-pole, becoming Bin=0, and further turning to an increase in S-pole is indicated by the above-mentioned hollow arrow (1).

Figure 21:
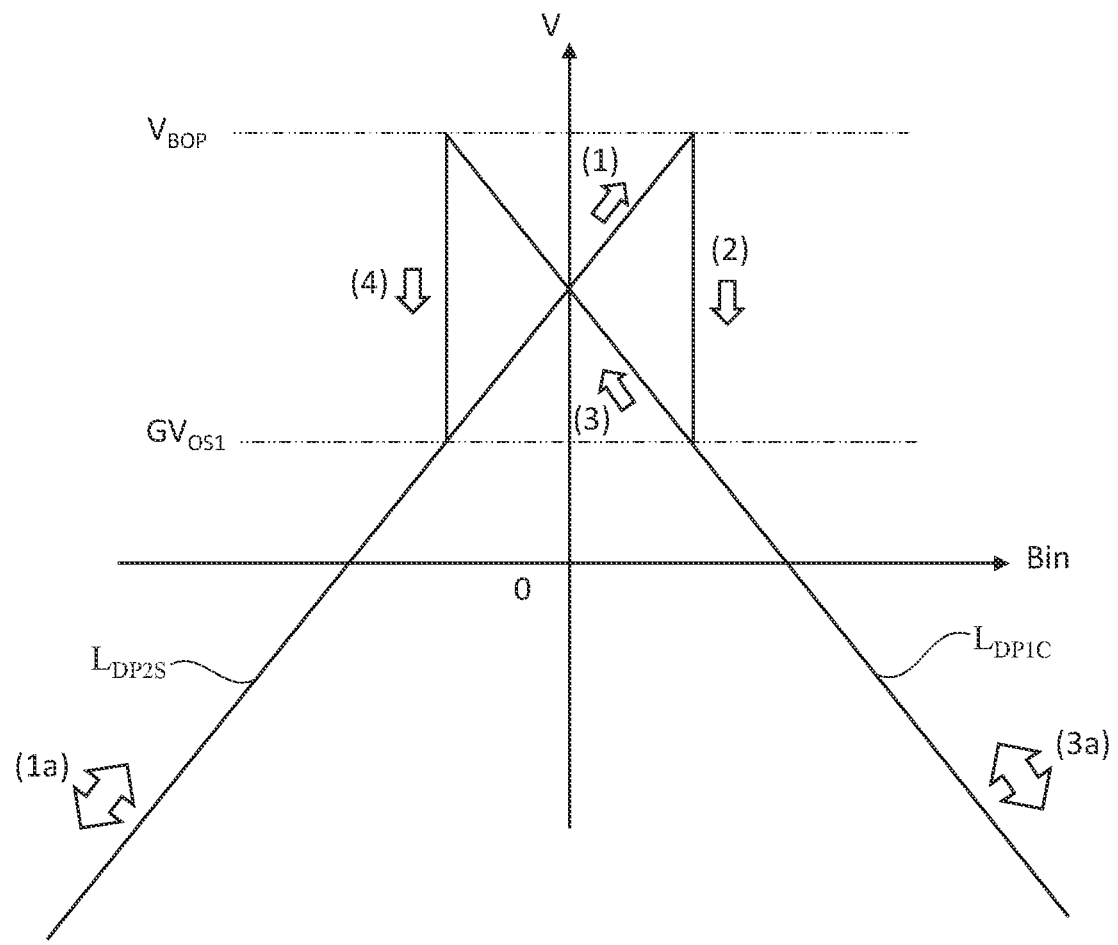
FIG. 21 is an enlarged diagram for illustrating a part Pa in an enlarged manner.

FIG. 20 is a schematic graph for showing a relationship between the signal S1 and the signal S3 with respect to the magnetic flux density Bin in a case of a magnetic offset of the horizontal Hall element 20 itself of the semiconductor device 1C being negative. FIG. 21 is an enlarged diagram for illustrating a part Pa of FIG. 20 in an enlarged manner.

In FIG. 20, a solid line $L_{DP1C}$ indicates such a magnetoelectric conversion characteristic that the magnetic offset Boson becomes positive in the case of the direction pair of the drive current being the first direction pair. A solid line $L_{DP2S}$ indicates such a magnetoelectric conversion characteristic that the magnetic offset $B_{OSDP}$ becomes negative in the case of the direction pair of the drive current being the second direction pair. The broken line $BL_{id1}$ indicates a magnetoelectric conversion characteristic obtained by taking a difference between magnetoelectric conversion characteristics in both directions in the case of the drive current flowing in the first direction pair. The broken line $BL_{id2}$ indicates a magnetoelectric conversion characteristic obtained by taking a difference between magnetoelectric conversion characteristics in both directions in the case of the drive current flowing in the second direction pair. The hollow arrows (1), (1a), (2), (3), (3a), and (4) each represent a hysteresis locus of the magnetoelectric conversion characteristic.

In addition, the magnetoelectric conversion characteristic shown in FIG. 20 is an example in a case of the fourth direction being selected in the first period Φ1 with the signal S3 at the H level, the second direction being selected in the second period Φ2 with the signal S3 at the H level, the third direction being selected in the first period Φ1 with the signal S3 at the L level, and the first direction being selected in the second period Φ2 with the signal S3 at the L level. In this example, during a period of the signal S3 at the H level, the chopper switch 70 is in the straight connection state as the first connection state, During a period of the signal S3 at the L level, the chopper switch 70 is in the cross connection state as the second connection state.

The hollow arrow (1) represents a locus on a magnetoelectric conversion characteristic corresponding to the solid line $L_{DP2S}$ in the case of the magnetic flux density Bin increasing toward the S-pole side with the signal S3 at the H level. The signal S3 transitions to the L level at a timing of the voltage supplied to the SH comparator 40C, namely, the voltage of the signal S1 exceeding the reference voltage $V_{BOP}$ (ΔV·G>$V_{BOP}$).

At the time of the signal S3 transitioning to the L level, the selected direction of the drive current is switched to the first direction pair, and the chopper switch 70 is further switched from the straight connection state to the cross connection state. In accordance with the level transition of the signal S3, the locus on the magnetoelectric conversion characteristic corresponding to the solid line $L_{DP2S}$ transitions to a locus on a magnetoelectric conversion characteristic corresponding to the solid line $L_{DP1C}$ (hollow arrow (2)). After that, in the case of the magnetic flux density Bin further increasing toward the S-pole side, the voltage V further increases to the positive side along the solid line $L_{DP1C}$ (hollow arrow (3a)).

Meanwhile, the locus at times of the magnetic flux density Bin decreasing in S-pole, becoming Bin=0, and further turning to an increase in N-pole is indicated by the hollow arrow (3). After a further increase of the magnetic flux density Bin toward the N-pole side, at the timing of the voltage of the signal S1 exceeding the reference voltage $V_{BOP}$ ($\Delta V \cdot G > V_{BOP}$), the signal S3 transitions to the H level.

Through the transition of the signal S3 to the H level, the selected direction of the drive current is switched to the second direction pair, and the chopper switch 70 is further switched from the cross connection state to the straight connection state. In accordance with the level transition of the signal S3, the locus on the magnetoelectric conversion characteristic corresponding to the solid line $L_{DP1C}$ transitions to the locus on the magnetoelectric conversion characteristic corresponding to the solid line Lures (hollow arrow (4)).

After that, in the case of the magnetic flux density Bin further increasing toward the N-pole side, the voltage V further increases to the negative side along the solid line $L_{DP2S}$ (hollow arrow (1a)). Meanwhile, the locus at times of the magnetic flux density Bin decreasing in N-pole, becoming Bin=0, and further turning to an increase in S-pole is indicated by the above-mentioned hollow arrow (1). In the third embodiment, the shape of the hysteresis locus in the magnetoelectric conversion characteristic is the shape of the figure of eight. In this manner, the shape of the hysteresis locus in the magnetoelectric conversion characteristic in the third embodiment is different from the shape of the hysteresis locus in the magnetoelectric conversion characteristic in each of the first embodiment and the second embodiment, that is, the parallelogram shape.

In the third embodiment, it is possible to switch the magnetoelectric conversion characteristic by applying one predetermined reference voltage, for example, the reference voltage $V_{BOP}$. In addition, in the third embodiment, because one reference voltage is applied to switch the magnetoelectric conversion characteristic, the magnetic switch 10C can employ the reference voltage circuit 48 having a circuit scale smaller than that of the reference voltage circuit 46. Accordingly, the magnetic switch 10C can be formed to have a smaller circuit scale than those of the magnetic switches 10A and 10B.

According to the third embodiment, it is easier to suppress variations of the reference voltage being the cause of an asymmetric property between the S-pole and the N-pole by switching the magnetoelectric conversion characteristic based on one reference voltage than by switching the magnetoelectric conversion characteristic based on two reference voltages being the reference voltage $V_{BOP}$ and the reference voltage $V_{BRP}$ in the first embodiment and the second embodiment. In addition, the variations of the reference voltage $V_{BOP}$ in the magnetic switch 10C are more suppressed than the variations of two independent reference voltages being the reference voltage $V_{BOP}$ and the reference voltage $V_{BRP}$ in the magnetic switches 10A and 10B. Thus, according to the third embodiment, it is possible to obtain a magnetoelectric conversion switching characteristic having a satisfactory symmetric property between the S-pole and the N-pole.

The present invention is not limited to the above-described embodiments, and can be implemented in various forms other than the above-described embodiments in its implementation stage. Various omissions, replacements, and changes may be made thereto without departing from the gist of the invention. For example, a buffer or a delay element configured to send the drive control signals Sd1 to Sd4 and the transmission control signals St1 and St2 with a delay of a predetermined period of time may be further provided.

The semiconductor device 1C and the magnetic switch 10C described above exemplarily include the horizontal Hall element 20 as the Hall element, and may include the vertical Hall element 60 as the Hall element instead of the horizontal Hall element 20 in the same manner as the semiconductor device TB and the magnetic switch 10B. The chopper switch 70 may also be another circuit having the same function. That is, in the magnetic switch 10C, a circuit including the above-described differential input unit, differential output unit, switching unit, and control terminal and being configured to send the supplied signals by switching the supplied signals between in-phase or out-of-phase based on the signal S3 supplied from the control terminal can be employed instead of the chopper switch 70.

For example, a switch circuit configured by arranging switches configured to turn on (short-circuited) or turn off (open) based on the signal S3 supplied from the control terminal in parallel with a signal transmission path can be employed instead of the chopper switch 70. In a case of this switch circuit being employed in the magnetic switch 10C, a series resistance component can be further suppressed and more satisfactory noise characteristics can be obtained than in a case of the chopper switch 70 being employed in the magnetic switch 10C. Accordingly, it is possible to provide the magnetic switch 10C having a magnetoelectric conversion switching characteristic with satisfactory reproducibility by employing the above-described switch circuit instead of the chopper switch 70.

The magnetic switch 10C may include the amplifier 30 having a polarity inversion function instead of the chopper switch 70 and the amplifier 30 having no polarity inversion function.

The above-described magnetic switches 10A to 10C are alternation detection type magnetic switches, but may be configured as bipolar detection type magnetic switches. In a case of configuring the magnetic switches 10A to 10C as bipolar detection type magnetic switches, the magnetic switches 10A to 10C may be each configured so that the amplification factor of the amplifier 30 or the amplification factor of the amplifier 30 and the absolute value of the predetermined reference voltage of the SH comparator 40A or 40C can be switched depending on the signal level of the signal S3.

The configuration capable of switching the amplification factor of the amplifier 30 or the amplification factor of the amplifier 30 and the absolute value of the predetermined reference voltage of the SH comparator 40A or 40C can be formed of, for example, a logic circuit, a switch circuit including a switch configured to open and close based on the signal S3, or a circuit obtained by combining those circuits. In the case of forming the magnetic switches 10A to 10C as bipolar detection type magnetic switches, variations in detection distance of a magnetic body detection mechanism including the semiconductor device according to each of the first to third embodiments can be reduced even with lack of polarity control of magnets to be used in combination.

The above-described magnetic switches 10A to 10C may be each configured as a so-called unipolar detection type magnetic switch. The unipolar detection type magnetic switch is a magnetic switch having both the operating point $B_{OP}$ and the returning point $B_{RP}$ for the polarity of any one of the S-pole and the N-pole. In a case of configuring the magnetic switches 10A to 10C as unipolar detection type magnetic switches, addition of a control logic switching step at a time of manufacture enables the operating point $B_{OP}$ and the returning point $B_{RP}$ to be adjusted so that both the operating point $B_{OP}$ and the returning point $B_{RP}$ are obtained for the polarity of any one of the S-pole and the N-pole.

In each of the above-described embodiments, the horizontal Hall element 20 is exemplified as having the configuration including the electrodes 21 to 24 formed at the four corners of a square as illustrated in each of, for example, FIG. 1 and FIG. 17, but the present invention is not limited thereto. It suffices that the horizontal Hall element 20 has such a shape that at least the directions of the drive current can define the above-described four directions of from the first direction to the fourth direction. That is, the horizontal Hall element 20 may be formed in not only a square shape but also, for example, a cross shape, a polygonal shape such as an octagonal shape, or a circular shape. The number of electrodes 21 to 24 may be four or more.

In the above-described embodiment, the vertical Hall element 60 including the five electrodes 61 to 65, namely, five terminals, is exemplified, but the present invention is not limited thereto. It suffices that the vertical Hall element 60 is configured so that at least the directions of the drive current can define the above-described four directions of from the first direction to the fourth direction.

In each of the above-described embodiments, the logic circuit 57 is not limited to the logical operation elements and circuit configuration exemplified in FIG. 3. Any logical operation element and any circuit configuration may be used as long as the circuit can obtain the same logical operation result at a time of reception of the above-described input signal.

In each of the above-described embodiments, the switch circuit 58 configured to switch the control logic pattern is described as an example of means for switching the control logic pattern, but the means for switching the control logic pattern is not limited thereto. For example, the switches SL1a, SL2a, SL1b, SL2b, SL1c, and SL2c may be mechanical switches, electronic switches such as transistors, or a combination of those switches.

The switches SL1a, SL2a, SL1b, SL2b, SL1c, and SL2c may each be a switch including a control terminal. In a case of employing the switches SL1a, SL2a, SL1b, SL2b, SL1c, and SL2c each being openable and closable depending on the signal supplied from the control terminal, it is possible to construct a semiconductor device and magnetic switch capable of automatically switching between the first control logic pattern and the second control logic pattern depending on a change in factor of interest.

For example, the factor of interest is set to the polarity of the asymmetric property of a voltage offset of the Hall element, and the magnetic switches 10A to 10C are each further provided with a detection circuit configured to detect the polarity of the asymmetric property of the voltage offset of the Hall element. The detection circuit sends a signal based on a result of detecting the polarity of the asymmetric property of the voltage offset of the Hall element. The magnetic switch is configured to supply the signal sent from the detection circuit to the control terminal of each of the switches SL1a, SL2a, SL1b, SL2b, SL1c, and SL2c. The magnetic switch configured as described above and the semiconductor device including this magnetic switch can switch the control logic pattern to the first control logic pattern or the second control logic pattern depending on the polarity of the asymmetric property of the voltage offset of the Hall element.

The configuration may further include a circuit configured to evaluate the absolute value of a voltage offset difference of the Hall element, to thereby correct at least any one of the amplification factor G of the amplifier 30 or the reference voltage $V_{BOP}$ and the reference voltage $V_{BRP}$ of the SH comparator 40A based on a signal indicating an evaluation result of this circuit. In this case, it is possible not only to set the magnetic offset $B_{OS}$ on the magnetoelectric conversion switching characteristic to zero, but also to suppress the operating point $B_{OP}$ and the returning point $B_{RP}$ caused by the magnetic offset $B_{OSDP}$ of the Hall element from deviating from the design values.

The means for switching the control logic pattern may further include a control circuit configured to perform a control operation based on the first control logic pattern, a second control circuit configured to perform a control operation based on the second control logic pattern, and a control circuit selection switch configured to switch the control circuit to one of the above-described control circuit and the above-described second control circuit.

For example, the control circuit 50 in the connection state with the switches SL1a, SL1b, and SL1c turned "on" and the switches SL2a, SL2b, and SL2c turned "off" as exemplified in FIG. 3 is set as the control circuit configured to perform the control operation based on the first control logic pattern. Meanwhile, the control circuit 50 in the connection state with the switches SL1a, SL1b, and SL1c turned "off" and the switches SL2a, SL2b, and SL2c turned "on" is set as the second control circuit. In this case, it suffices that the control circuit selection switch is configured to connect the control circuit and the second control circuit in parallel, and to be able to switch whether a circuit serving as a supply destination of the signal S3 and serving as a supply source of the drive control signals Sd1 to Sd4 and the transmission control signals St1 and St2 is to be set as the control circuit or as the second control circuit.

In each of the above-described embodiments, the switch circuit 58 is provided to the control circuit 50, but may be formed as an independent circuit separate from the control circuit 50. In this case, the reference clock signal CLK and the signal S3 having signal levels switched by the switch circuit 58 are supplied to the control circuit 50.

In the above-described embodiments, the cases of the horizontal Hall element 20 and the vertical Hall element 60 each being a single element are described, but a configuration including a plurality of Hall element cells connected in parallel may be employed from the viewpoint of suppressing the magnitude of the magnetic offset $B_{OSDP}$. According to the configuration including the plurality of Hall element cells connected in parallel, it is possible to reduce the deviation of the operating point $B_{OP}$ and the returning point $B_{RP}$ from the design values. Accordingly, the magnetic switches 10A to 10C each employing the Hall element configured by connecting the plurality of Hall element cells in parallel can obtain magnetoelectric conversion switching characteristics closer to the design values than the magnetic switches 10A to 10C each including the Hall element configured without connecting the plurality of Hall element cells in parallel, that is, the Hall element being a single element.

In a case of placing emphasis on processing speed, because of being able to suppress a time constant and output resistance of the Hall element, the magnetic switches 10A to 10C each including the Hall element configured by connecting the plurality of Hall element cells in parallel can increase the processing speed as compared with the magnetic switches 10A to 10C each including the Hall element formed of a single element.

In each of the above-described embodiments, the case of connecting the drive terminal 11P to the first power source and connecting the drive terminal 11N to the second power source, that is, the case of employing a constant voltage source as a drive power source of each of the magnetic switches 10A to 10C is described. However, a constant current source may be employed as the drive power source of each of the magnetic switches 10A to 10C.

If each of the magnetic switches 10A to 10C includes the constant voltage source as the drive power source, a constant current source circuit for driving may not be employed. Thus, there is an advantage that the circuit scale is smaller than in the case of employing the constant current source as the drive power source. Meanwhile, in the case of employing the constant current source as the drive power source, there is an advantage that the residual offset voltage of the Hall element is relatively smaller than in the case of employing the constant voltage source as the drive power source.

In each of the above-described embodiments, the case of the signal processing of each of the magnetic switches 10A to 10C in a voltage mode is described, but a part or entirety of the signal processing may be set in a current mode. In the signal processing in the current mode which is faster than the signal processing in the voltage mode, it is easier to raise the reference clock frequency as compared with the case of employing the signal processing in the voltage mode. Accordingly, the magnetic switches 10A to 10C involving the signal processing in the current mode can have detection accuracy and signal processing speed further improved as compared with the magnetic switches 10A to 10C involving the signal processing in the voltage mode.

In the above-described embodiments, the configuration examples of the magnetic switches 10A to 10C employing the amplifier 30 of a differential input/single-phase output type and the SH comparators 40A and 40C of a single-phase input type are described. However, the amplifier 30 and the SH comparators 40A and 40C are not limited to those examples. In the magnetic switches 10A to 10C, the amplifier 30 of a differential input/output type and the SH comparators 40A and 40C of a differential input type may be employed. In this case, it is possible to provide the magnetic switches 10A to 10C being relatively robust against in-phase noise superimposed from, for example, a power source.

The above-described embodiments and their modifications are included in the scope and gist of the invention, and are also included in the scope of the invention and its equivalents described in the appended claims.

What is claimed is:

1. A semiconductor device, comprising a magnetic switch provided to a semiconductor substrate, the magnetic switch including:
    a Hall element including:
        a first electrode and a second electrode which are arranged on a first straight line; and
        a third electrode and a fourth electrode which are arranged on a second straight line perpendicular to the first straight line;
    a first switch circuit including a plurality of switches, the first switch circuit being configured to select one direction as a direction of a drive current of the Hall element from four directions of a first direction from the first electrode to the second electrode, a second direction from the second electrode to the first electrode, a third direction from the third electrode to the fourth electrode, and a fourth direction from the fourth electrode to the third electrode;
    a comparison circuit configured to alternately perform a first operation for sampling a signal transmitted from the Hall element and a second operation for sending a result signal which is based on a result of comparing a reference value and a value of a difference signal between the signal transmitted from the Hall element and the signal sampled by the first operation;
    a latch circuit configured to hold the result signal sent from the comparison circuit, and send the held result signal as a latch output signal; and
    a control circuit configured to select one mode based on the latch output signal from: a first mode of controlling open/closed states of the plurality of switches so as to cause the drive current to flow in the third direction in a first period for performing the first operation and flow in the first direction in a second period for performing the second operation; and a second mode of controlling open/closed states of the plurality of switches so as to cause the drive current to flow in the second direction in the first period and flow in the fourth direction in the second period.

2. The semiconductor device according to claim 1, wherein the control circuit includes:
    a first input terminal configured to receive the latch output signal;
    a second input terminal configured to receive a reference clock signal having a total period of the first period and the second period as one cycle period;
    a control signal generation circuit configured to generate, based on the latch output signal supplied from the first input terminal, four control signals synchronized with the reference clock signal supplied from the second input terminal; and
    a first control signal output terminal configured to send a first control signal among the four control signals, a second control signal output terminal configured to send a second control signal among the four control signals, a third control signal output terminal configured to send a third control signal among the four control signals, and a fourth control signal output terminal configured to send a fourth control signal among the four control signals.

3. The semiconductor device according to claim 2, wherein the magnetic switch further includes:
    a second control circuit including the first input terminal, the second input terminal, the control signal generation circuit, and the first control signal output terminal to the fourth control signal output terminal, the second control circuit being configured to select another mode different from the one of the first mode and the second mode based on the latch output signal; and
    a control circuit selection switch configured to switch a terminal for receiving the latch output signal and a terminal for sending the four control signals between: the first input terminal of the control circuit and the first control signal output terminal to the fourth control signal output terminal; and the first input terminal of the second control circuit and the first control signal output terminal to the fourth control signal output terminal.

4. The semiconductor device according to claim 2, wherein the magnetic switch further includes:
   a first drive terminal connected to a first power source; and
   a second drive terminal connected to a second power source,
   wherein the Hall element is connected to each of the first drive terminal and the second drive terminal through the plurality of switches, and
   wherein the plurality of switches include:
      a first switch containing a control terminal configured to receive one of the four control signals sent from the first control signal output terminal, the first switch being configured to open and close a path between the first drive terminal and the first electrode;
      a second switch containing a control terminal configured to receive one of the four control signals sent from the first control signal output terminal, the second switch being configured to open and close a path between the second electrode and the second drive terminal;
      a third switch containing a control terminal configured to receive one of the four control signals sent from the second control signal output terminal, the third switch being configured to open and close a path between the first drive terminal and the third electrode;
      a fourth switch containing a control terminal configured to receive one of the four control signals sent from the second control signal output terminal, the fourth switch being configured to open and close a path between the fourth electrode and the second drive terminal;
      a fifth switch containing a control terminal configured to receive one of the four control signals sent from the third control signal output terminal, the fifth switch being configured to open and close a path between the first drive terminal and the second electrode;
      a sixth switch containing a control terminal configured to receive one of the four control signals sent from the third control signal output terminal, the sixth switch being configured to open and close a path between the first electrode and the second drive terminal;
      a seventh switch containing a control terminal configured to receive one of the four control signals sent from the fourth control signal output terminal, the seventh switch being configured to open and close a path between the first drive terminal and the fourth electrode; and
      an eighth switch containing a control terminal configured to receive one of the four control signals sent from the fourth control signal output terminal, the eighth switch being configured to open and close a path between the third electrode and the second drive terminal.

5. The semiconductor device according to claim 1, wherein the control circuit includes:
   a first input terminal configured to receive the latch output signal;
   a second input terminal configured to receive a reference clock signal having a total period of the first period and the second period as one cycle period;
   a logic circuit including a logical operation element connected to the first input terminal and the second input terminal, the logic circuit being configured to obtain, based on the latch output signal supplied from the first input terminal, four control signals synchronized with the reference clock signal supplied from the second input terminal; and
   a first control signal output terminal configured to send a first control signal among the four control signals, a second control signal output terminal configured to send a second control signal among the four control signals, a third control signal output terminal configured to send a third control signal among the four control signals, and a fourth control signal output terminal configured to send a fourth control signal among the four control signals.

6. The semiconductor device according to claim 5, wherein the logic circuit includes a second switch circuit provided between: the first input terminal and the second input terminal; and the logical operation element, and
   wherein the second switch circuit includes a first path and a second path different from the first path so as to be switchable to each other between: the first input terminal and the second input terminal; and the logical operation element.

7. The semiconductor device according to claim 6, wherein the control circuit is configured to:
   generate, based on the latch output signal supplied through the first path, a first control signal, a second control signal, a third control signal, and a fourth control signal as the four control signals synchronized with the reference clock signal supplied from the second input terminal, send the first control signal from the first control signal output terminal, send the second control signal from the second control signal output terminal, send the third control signal from the third control signal output terminal, and send the fourth control signal from the fourth control signal output terminal; and
   generate, based on the latch output signal supplied through the second path, a fifth control signal, a sixth control signal, a seventh control signal, and an eighth control signal as the four control signals synchronized with the reference clock signal supplied from the second input terminal, send the fifth control signal from the first control signal output terminal, send the sixth control signal from the second control signal output terminal, send the seventh control signal from the third control signal output terminal, and send the eighth control signal from the fourth control signal output terminal.

8. The semiconductor device according to claim 1, wherein the comparison circuit includes:
   a reference voltage circuit containing an output terminal configured to apply, as the reference value, any one voltage selected from a first voltage and a second voltage different from the first voltage;
   a sample-and-hold amplifier containing:
      a first input terminal configured to receive a signal transmitted from the Hall element;

a second input terminal configured to receive a reference clock signal having a total period of the first period and the second period as one cycle period; and an output terminal configured to send a value of the difference signal between a signal sampled in the first period and a signal transmitted from the Hall element in the second period; and a comparator containing:

a first input terminal connected to the output terminal of the sample-and-hold amplifier;

a second input terminal connected to the output terminal of the reference voltage circuit; and an output terminal configured to send a result signal which is based on a result of comparing a value of the signal supplied from the first input terminal and the reference value supplied from the second input terminal.

9. The semiconductor device according to claim 1, wherein the magnetic switch further includes a chopper switch containing: a first input terminal; a second input terminal; a first output terminal connected to the first input terminal through an openable and closable first path and connected to the second input terminal through an openable and closable second path; a second output terminal connected to the second input terminal through an openable and closable third path and connected to the second input terminal through an openable and closable fourth path; and a control terminal configured to receive the latch output signal, the chopper switch being configured to switch, based on the latch output signal supplied from the control terminal, a connection state between a first connection state of the first path and the fourth path being closed and the second path and the third path being opened and a second connection state of the first path and the fourth path being opened and the second path and the third path being closed, wherein the chopper switch is provided in a stage before the comparison circuit, and wherein the comparison circuit includes:

a sample-and-hold amplifier containing:

a reference voltage circuit configured to apply a predetermined reference voltage;

a first input terminal configured to receive a signal transmitted from the Hall element;

a second input terminal configured to receive a reference clock signal having a total period of the first period and the second period as one cycle period; and an output terminal configured to send a value of the difference signal between a signal sampled in the first period and a signal transmitted from the Hall element in the second period; and a comparator containing:

a first input terminal connected to the output terminal of the sample-and-hold amplifier;

a second input terminal connected to an output terminal of the reference voltage circuit; and an output terminal configured to send a result signal which is based on a result of comparing a value of the signal supplied from the first input terminal and the reference value supplied from the second input terminal.

10. The semiconductor device according to claim 1, wherein the Hall element is a horizontal Hall element configured to obtain an output corresponding to a magnetic flux density perpendicular to the semiconductor substrate.

11. The semiconductor device according to claim 1, wherein the Hall element is a vertical Hall element configured to obtain an output corresponding to a magnetic flux density parallel with the semiconductor substrate.

12. The semiconductor device according to claim 1, wherein the Hall element includes a plurality of Hall element cells, and the plurality of Hall element cells are connected in parallel.

* * * * *